United States Patent
Toda

(10) Patent No.: US 7,995,372 B2
(45) Date of Patent: Aug. 9, 2011

(54) RESISTANCE CHANGE MEMORY DEVICE WITH STABILIZING CIRCUIT COUPLED IN SERIES WITH SELECTED RESISTANCE CHANGE MEMORY CELL

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 12/403,845

(22) Filed: Mar. 13, 2009

(65) Prior Publication Data

US 2009/0279344 A1 Nov. 12, 2009

(30) Foreign Application Priority Data

May 7, 2008 (JP) .................................. 2008-121594

(51) Int. Cl.
 *G11C 11/00* (2006.01)
(52) U.S. Cl. ..................... 365/148; 365/175; 365/189.16
(58) Field of Classification Search .............. 365/148 O, 365/163, 175 X, 189.011, 189.16 X, 230.06, 365/148, 175, 189.16
See application file for complete search history.

(56) References Cited

U.S. PATENT DOCUMENTS

| | | | |
|---|---|---|---|
| 5,787,042 A | 7/1998 | Morgan | |
| 6,038,160 A | 3/2000 | Nakane et al. | |
| 7,110,290 B2 | 9/2006 | Ooishi | |
| 7,295,462 B2 * | 11/2007 | Farnworth | 365/158 |
| 7,433,222 B2 * | 10/2008 | Hosoi et al. | 365/148 |
| 2008/0002456 A1 | 1/2008 | Toda et al. | |

OTHER PUBLICATIONS

U.S. Appl. No. 12/549,948, filed Aug. 28, 2009, Toda.
U.S. Appl. No. 12/607,432, filed Oct. 28, 2009, Toda.
U.S. Appl. No. 12/605,799, filed Oct. 26, 2009, Toda.
U.S. Appl. No. 12/691,169, filed Jan. 21, 2010, Toda.
Y. Hosoi, et al., "High Speed Unipolar Switching Resistance RAM (RRAM) Technology", IEEE International Electron Devices Meeting 2006, Technical Digest, 4 Pages.

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A resistance change memory device includes: a memory cell formed of a variable resistance element and a diode connected in series, the state of the variable resistance element being reversibly changed in accordance with applied voltage or current; and a stabilizing circuit so coupled in series to the current path of the memory cell as to serve for stabilizing the state change of the memory cell passively.

18 Claims, 28 Drawing Sheets

$I = K\{(V_{gs}-V_t)V_{ds} - V_{ds}^2/2\}$
$I = (K/2)(V_{gs}-V_t)^2$ $I = I_0\{\exp(V/V_f)-1\}$ $V = IR$ Reset Mode Read Mode Standby Mode Leakage between Stacked Cell Arrays
(Read Mode with Unselected BL = Vs*)

Leakage between Stacked Cell Arrays
(Read Mode with Unselected BL = floating)

| mode \ gate | Vm | Vg | read |
|---|---|---|---|
| Read | Vdd | Vg_read | Vdd |
| Reset("0"Write) | Vss | Vg_reset | Vss |
| Set("1"Write) | Vm_set | >Vdd+Vt | Vss |

FIG. 34
| mode \ gate | Vm | Vg | read |
|---|---|---|---|
| Read | Vss | Vg_read | Vdd |
| Reset("0"Write) | Vdd | Vg_reset | Vss |
| Set("1"Write) | Vm_set | <Vss-Vtp | Vss |
FIG. 36
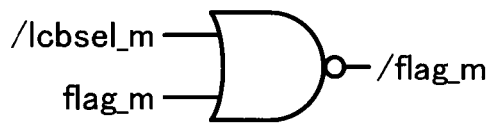
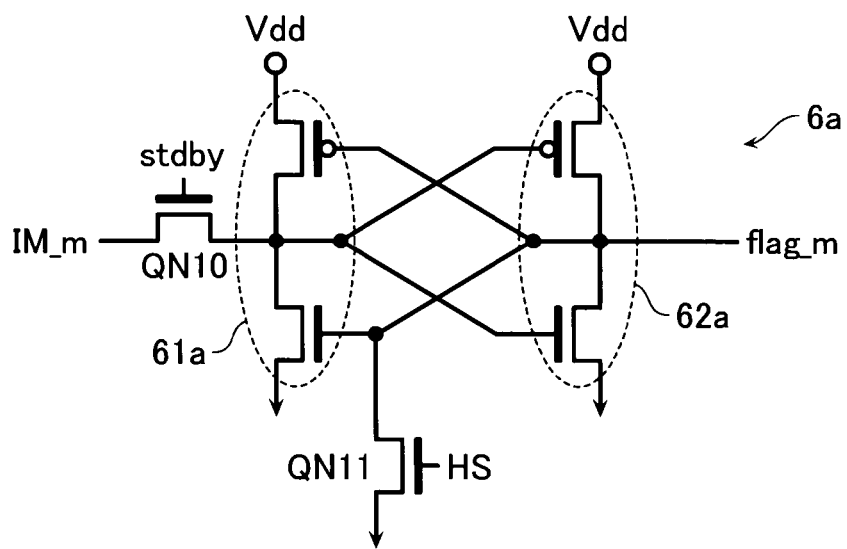

RESISTANCE CHANGE MEMORY DEVICE WITH STABILIZING CIRCUIT COUPLED IN SERIES WITH SELECTED RESISTANCE CHANGE MEMORY CELL

CROSS-REFERENCE TO RELATED APPLICATION

This application is based on and claims the benefit of priority from the prior Japanese Patent Application No. 2008-121594, filed on May 7, 2008, the entire contents of which are incorporated herein by reference.

BACKGROUND OF THE INVENTION

1. Field of the Invention

This invention relates to a resistance change memory device, specifically to a method of stabilizing the resistance change.

2. Description of the Related Art

It has been proposed such a resistance change memory (ReRAM) that stores a resistance value as data, which is reversibly changed by applying voltage, current or heat, and it is noticed for succeeding to the conventional NAND-type flash memory. This resistance change memory is suitable for shrinking the cell size, and for constituting a cross-point cell array. In addition, it is easy to stack cell arrays. Therefore, it is expected of ReRAM to achieve a large capacitive file memory with a three dimensional (3D-) cell array structure.

Especially, a unipolar type of ReRAM cell has such a feature that the high resistance state and low resistance state are reversibly settable by controlling the applied voltage and applying time thereof. For example, refer to Y. Hosoi et al, "High Speed Unipolar Switching Resistance RAM(RRAM) Technology" IEEE International Electron Devices Meeting 2006, Technical Digest, P. 793-796.

To set ReRAM's data (a resistance state) stably, it is in need of precisely controlling the voltage or current to be applied to a cell. This is because of that the cell's resistance is changed drastically while setting the resistance value, and the circuit condition of generating voltage or current also is changed drastically.

SUMMARY OF THE INVENTION

According to an aspect of the present invention, there is provided a resistance change memory device including:

a memory cell formed of a variable resistance element and a diode connected in series, the state of the variable resistance element being reversibly changed in accordance with applied voltage or current; and a stabilizing circuit so coupled in series to the current path of the memory cell as to serve for stabilizing the state change of the memory cell passively.

According to another aspect of the present invention, there is provided a resistance change memory device including:

a cell array including first and second signal lines crossing each other and memory cells disposed at the cross-points of the first and second signal lines, the memory cell having a variable resistance element and diode connected in series, the state of the variable resistance element being reversibly changed in accordance with applied voltage or current;

a sense amplifier selectively coupled to a bit line, one of the first and second signal lines serving as bit lines;

a word line driver configured to selectively drive a word line with low impedance, the other of the first and second signal lines serving as word lines; and a stabilizing circuit so coupled in series to a current path of a selected memory cell via a selected bit line as to serve for stabilizing the state change of the selected memory cell in a reset or set mode.

BRIEF DESCRIPTION OF THE DRAWINGS

FIG. 34 is a table showing operation modes and the setting conditions of selection signals.

FIG. 36 shows a bad cell detection circuit.

DETAILED DESCRIPTION OF THE EMBODIMENTS

Illustrative embodiments of this invention will be explained with reference to the accompanying drawings below.

Figure 1:
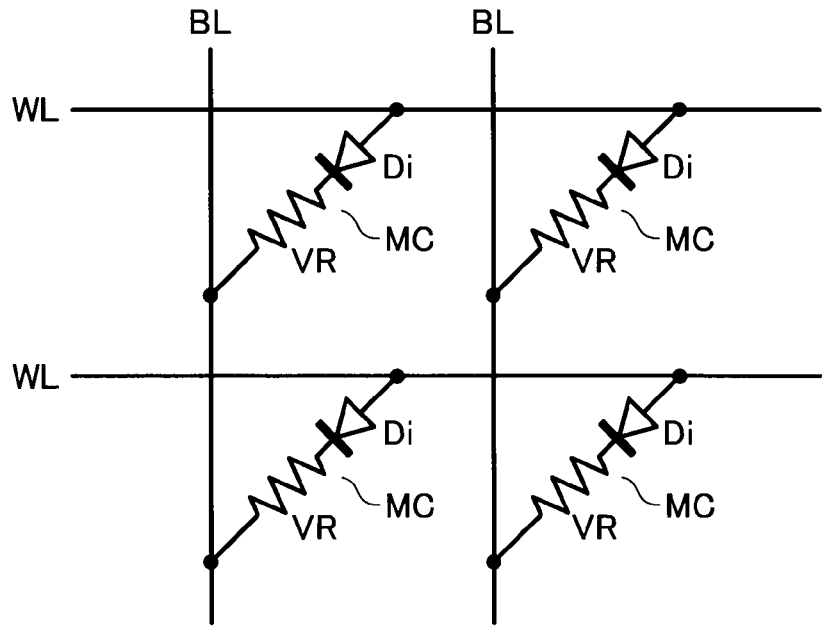
FIG. 1 shows an equivalent circuit of the basic cell array of a ReRAM.

In a unipolar type of and a cross-point type of ReRAM, as shown in FIG. 1, memory cells MC are deposited at the cross-points of signal lines crossing each other. Each memory cell MC is formed of variable resistance element VR and diode Di. In this example, a signal line on the anode side of diode Di is defined as word line WL; and the other signal line of the cathode side as bit line BL.

In such a memory cell arrangement, binary data is defined by a high resistance state (or reset state) and a low resistance state (or set state) of the variable resistance element VR.

The principle of the data write or program is as follows. Applying voltage higher than a certain set-use voltage value Vset to variable resistance element VR held in a high resistance state (i.e., reset state), its state is changed to a low resistance state. This state change will be referred to as "set operation" hereinafter. Applying current higher than a certain reset-use current value Ireset to the variable resistance element VR held in a low resistance state (i.e., set state), its state is changed to a high resistance state due to Joule's heat. This state change will be referred to as "reset operation" hereinafter.

If cell current or voltage is not controlled at all in the above-described operations of variable resistance element VR, the cell's state will be vibrated. That is, if variable resistance element VR is changed to the low resistance state in accordance with the set operation, large current flows, and it brings the element into a reset mode. By contrast, if variable resistance element VR is changed to the high resistance state in accordance with the reset operation, large voltage is applied to it, and this brings the element into a set mode.

This situation will be explained in detail with reference to FIG. 2.

It is assumed here that both ends of memory cell MC (diode Di and variable resistance element VR connected in series) are set at Va and Vs, and element VR may be applied with set voltage Vset in a high resistance state while it may be applied with reset current Ireset in a low resistance state.

Figure 2:
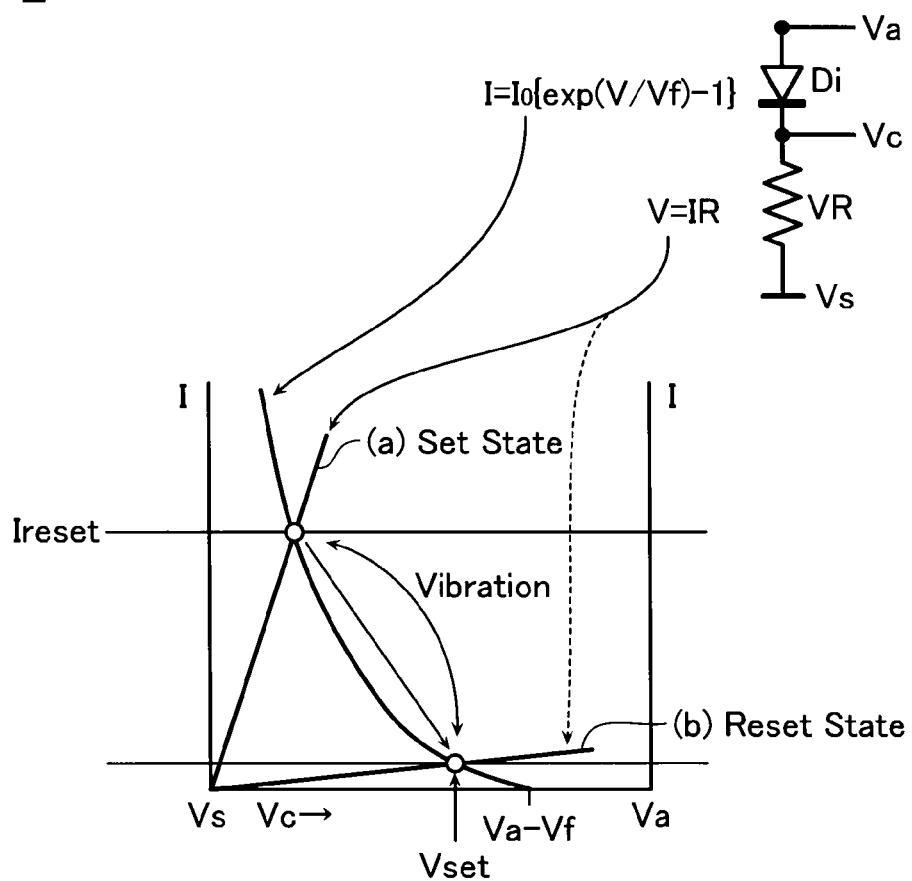
FIG. 2 shows a state change vibration of ReRAM.

In FIG. 2, voltage-current characteristics (V=IR) of (a) set state and (b) reset state of the variable resistance element VR are shown with the load curve of diode Di superimposed. As understood from FIG. 2, it is generated such vibration that when variable resistance element VR held in a reset state is applied with set voltage Vset and changed to a set state, reset current Ireset flows in the element VR and it is restored to the reset state.

Therefore, in case of storing data, for example, "0" and "1" in correspondence to the reset state and set state, respectively, it is required of the memory cell to be controlled in such a manner that the variable resistance element VR is set in a stable state without oscillation in a program mode.

For example, it will be considered such an active method as to insert a switch device in the current path of the variable resistance element VR, and turn off it when program completion is detected based on the cell current in a program mode. By use of this method, it becomes possible to control the variable resistance element VR to be set in a stable state without vibration. However, to achieve this method, it is in need of preparing many transistors, and carefully controlling the circuit constant.

By contrast, in this embodiment, to simply suppress the state vibration of the variable resistance element VR, voltage "Va" is automatically controlled. In detail, current saturation and current non-saturation characteristics of a MOS transistor are used. That is, by use of the operating point change of a MOS transistor in accordance with the state change of the memory cell, the set and reset states of the memory cell are automatically set in a stable state.

[Stabilization of Change to Reset State]

Figure 3:
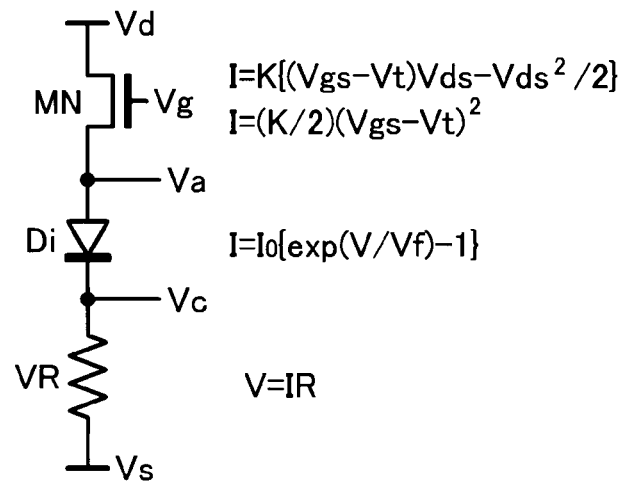
FIG. 3 shows a memory cell with an NMOS transistor attached for stabilizing the change to reset state.

With reference to FIG. 3, it will be explained a method of automatically stabilizing the change to a reset state of variable resistance element VR. As shown in FIG. 3, an N-channel transistor (referred to as NMOS transistor hereinafter) MN is coupled in series to the current path of the variable resistance element VR. NMOS transistor MN serves as a stabilizing device used for passively stabilizing the state change.

The gate and drain of NMOS transistor MN are applied with Vg and Vd, respectively. Here, Vd serves as a set-use and reset-use power supply voltage (i.e., voltage source).

With this construction, by use of that the effective resistance value of transistor MN is changed in accordance with current flowing therein, it is controlled in such a state that source voltage Va of transistor MN is never boosted to be higher than a certain level even if variable resistance element VR is changed to a reset state.

Figure 4:
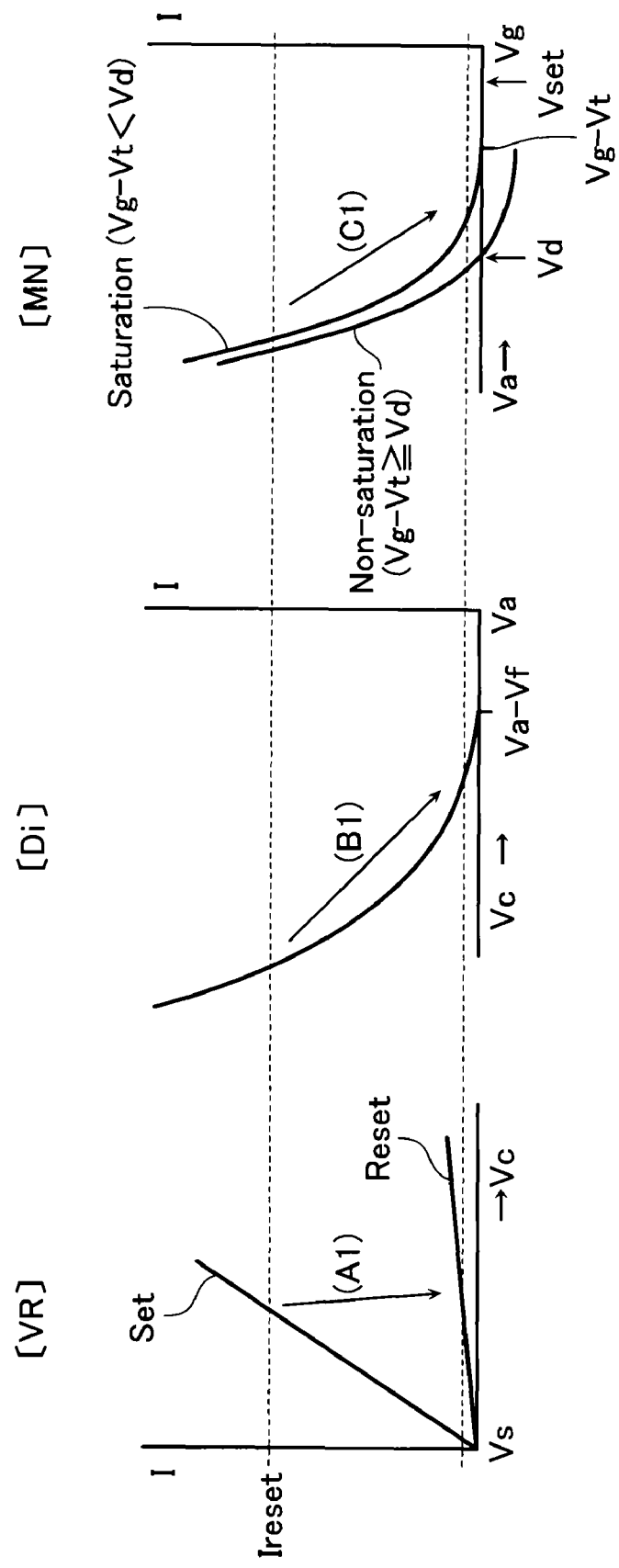
FIG. 4 shows the characteristics of the respective devices in FIG. 3.

FIG. 4 shows voltage-current characteristics of variable resistance element VR, diode Di and NMOS transistor MN arranged in parallel on the lateral axis with base potentials Vs, Va and Vg (Vs<Va<Vg), respectively.

The voltage (V)–current (I) characteristic of MNOS transistor MN will be expressed in general with gate-source voltage Vgs, drain-source voltage Vds and threshold voltage Vt as follows: $I=K\{(Vgs-Vt)Vds-Vds^2/2\}$ in the current non-saturation region defined by $Vgs-Vt \geq Vds$; and $I=(K/2)(Vgs-Vt)^2$ in the current saturation region defined by $Vgs<Vds$. "Current saturation region" and "current non-saturation region" are simply referred to as "saturation region" and "non-saturation region", hereinafter. The "non-saturation region" is often referred to as "linear region" or triode region".

The voltage (V)–current (I) characteristic of diode Di is expressed by $I=I0\{\exp(V/Vf)-1\}$ (where, I0; saturation current, and Vf; forward voltage drop); and the voltage (V)–current (I) characteristic of variable resistance element VR is expressed by V=IR.

These characteristics may be rewritten with voltages at the respective nodes (i.e., drain node voltage Vd, source node voltage (diode anode voltage) Va, gate node voltage Vg and diode cathode voltage Vc) as follows.

Characteristic of transistor MN (non-saturation region):

$$I=K\{(Vg-Va-Vt)(Vd-Va)-(Vd-Va)^2/2\};\ Vg-Vt \geq Vd$$

Characteristic of Transistor MN (Saturation Region):

$$I=(K/2)(Vg-Va-Vt)^2;\ Vg-Vt \leq Vd$$

Characteristic of Diode Di:

$$I=I0\{\exp(Va-Vc)/Vf-1\};\ Va-Vc \geq Vf$$

Characteristic of Variable Resistance Element VR:

$$I=(Vc-Vs)R$$

In FIG. 4, these voltage (V)–current (I) characteristics are shown in parallel on the lateral axis, on which the base voltages Vs, Va and Vg are set. Shown on the vertical axis is the common current amount of the serially connected devices.

When variable resistance element VR is changed from the set state to the reset state with reset current Ireset applied (as shown by arrow A1), voltage Vc is boosted in accordance with that variable resistance element VR becomes a high resistance state, so that the current of diode Di is reduced (as shown by arrow B1), and source voltage Va is boosted (as shown by arrow C1). In case the transistor MN operates in the saturation region, the source voltage Va is not boosted over Vg−Vt. In case the transistor MN operates in the non-saturation region, the source voltage Va is not boosted over Vd. Therefore, applying such a gate bias as to suppress the source voltage change under a certain level, it becomes possible to suppress the applied voltage of variable resistance element VR to be under the set voltage Vset.

Explaining in other words, if circuit parameters are set under the condition that the set voltage Vset of the variable resistance element VR is set to be higher than Vg−Vt, set voltage Vset will not be applied to the variable resistance element VR even if it is reset, so that the element VR is kept stably in the reset state.

Figure 5:
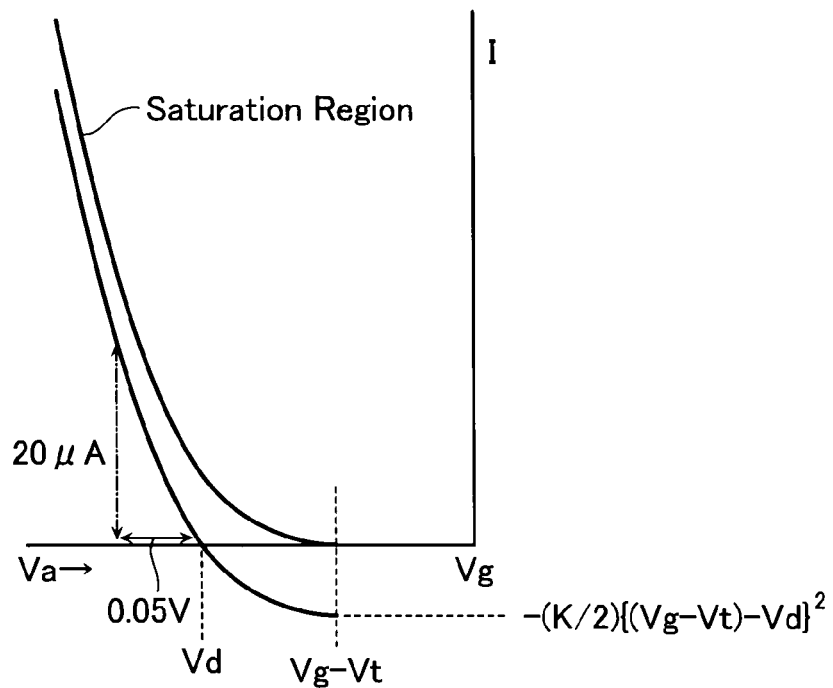
FIG. 5 shows a characteristic of NMOS transistor for explaining the stabilization of the change to reset state.

With reference to FIG. 5, the above-described principle of stabilization of the reset state will be examined in detail under the condition that transistor parameters are set suitably.

It is assumed that as practical specifications of transistor, 20 μA may be carried at drain-source voltage Vds=0.05 [v]. It is further assumed that the transistor, for example with threshold voltage Vt=0.6 [v], is used at a high source voltage, the threshold voltage rises up by ΔVt=0.4 [v] as a result of the back-gate bias effect. In this case, parameter K in the expression of the transistor characteristic will be expressed as follows: K=280.7 [μA/v$^2$].

By use of this transistor model, the operations in the saturation region and non-saturation region will be examined under the condition that the set voltage of variable resistance element VR is Vset=1.5 [v], and the forward voltage drop of diode Di is Vf=0.7 [v].

1. In case the non-saturation region is used:

In this case, by use of threshold voltage Vt=0.6 [v], and ΔVt=0.4 [v], then Vt+ΔVt=1 [v], and it will be obtained Vg−1≧Vd. If Vd=2 [v], then Vg≧23 [v].

If setting Vg=3.5 [v], the expression of the non-saturation region is expressed as follows:

$$20=280.7\{(2.5-Va)(2-Va)-(2-Va)^2/2\}$$

Solving this expression, Va will be obtained as follows:

$$Va=2.5\pm sqrt(440.7/280.7\times 4)=1.87\ [v]$$

Here, "sqrt" means a square root.

Supposing that the lowermost voltage serving for making variable resistance element VR flow reset current Ireset is Vreset~0.65 [v], this is the lowest value of Vc. Since Va−Vf=1.17 [v], reset current Ireset will be sufficiently selected, and change to the reset state may occur.

Even if the variable resistance element VR is reset, the uppermost value of Va is 2 [v], and Va−Vf=1.3 [v], so that the voltage applied to the variable resistance element VR is not over the set voltage Vset=1.5 [v].

2. In case the saturation region is used:

In this case, the condition is Vg−1<Vd. Suppose that Vd=2.5 [v], and Vg<3.5 [v]. If setting Vg=3 [v], the expression of the saturation region is expressed as follows:

$$20=140.35(2-Va)^2$$

Solving this expression, Va will be obtained as follows:

$$Va=2-sqrt(20/140.35)=1.623\ [v]$$

Supposing that the lowermost voltage serving for making variable resistance element VR flow the reset current Ireset is Vreset~0.65 [v], this is the lowest value of Vc. Since Va−Vf=0.923 [v], reset current Ireset will be sufficiently selected, and change to the reset state may occur.

Even if the variable resistance element VR is reset, the uppermost value of Va is 2 [v], and Va−Vf=1.3 [v], so that the voltage applied to the variable resistance element VR is not over the set voltage Vset=1.5 [v].

As described above, without regard to whether the transistor operates in the saturation region or non-saturation region, the reset state is stably achieved. If suitably selecting Vd and Vg, a certain margin against change to the set state will be obtained.

Generalizing the above-described examples, it results in such an optimum value searching problem that based on the relationships between current I and voltages Vg, Vd, Va in the transistor characteristics, form three-dimensional map under the condition of I=Ireset (=20) and I=0, and search the center (Vg, Vd) in the overlap region satisfying a first condition of the lowest voltage Vrest+Vf<Va (I=20) to be applied to the variable resistance element VR necessary to make it flow Ireset; and a second condition of Va(I=20)<Vset+Vf necessary with respect to the set voltage Vset.

Figure 6:
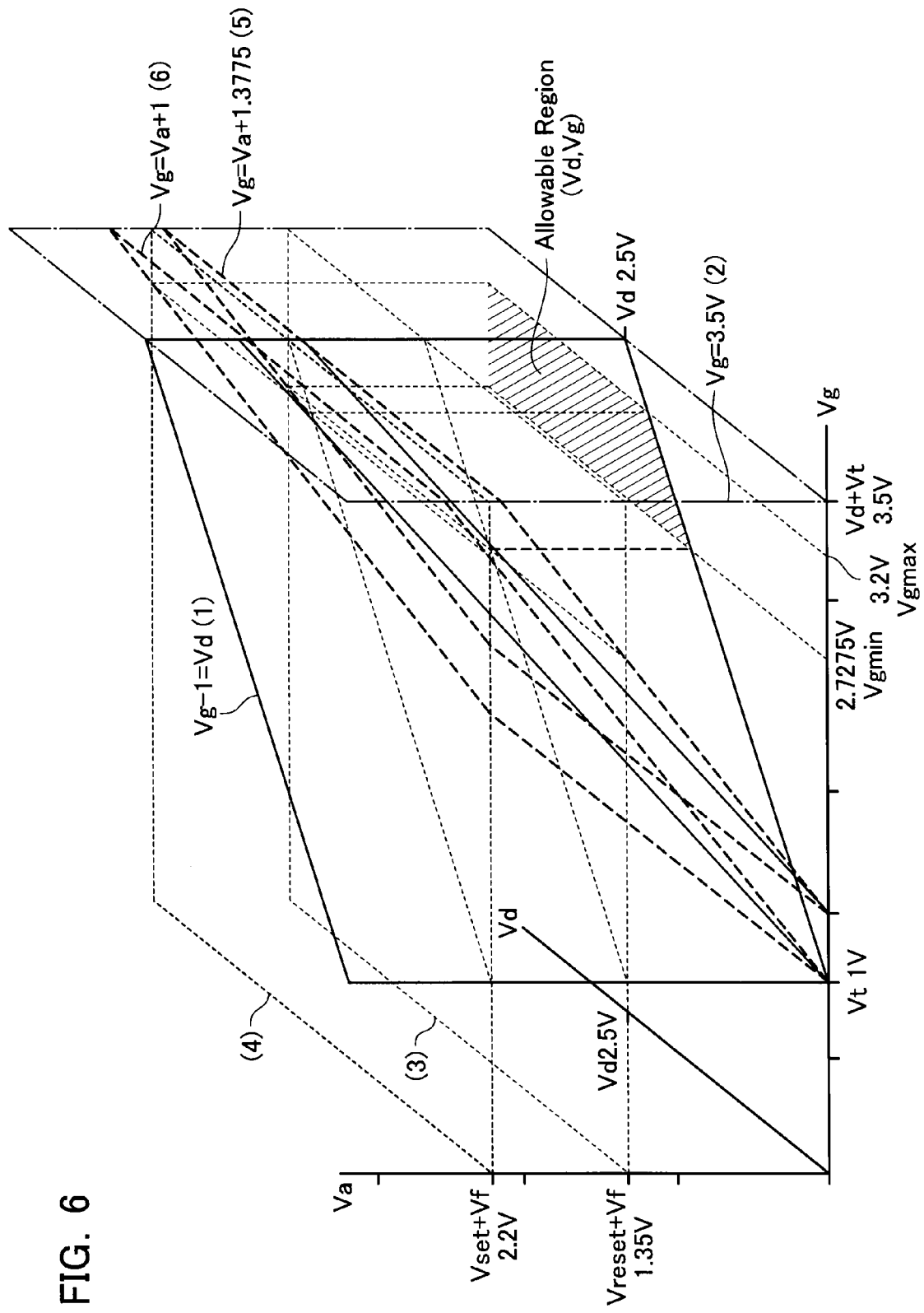
FIG. 6 shows a method for searching a general solution of the stabilization of the change to reset state.

The details will be explained below with reference to FIG. 6. If there is a margin when the saturation region is used, it becomes possible to control only with the gate voltage Vg. Therefore, the optimization in the saturation region shown in FIG. 4 will be examined.

Based on condition of the saturation region, the following relationship is obtained:

$$Vg=sqrt(2I/K)+Va+Vt;\ Vg-1<Vd$$

That is, what becomes object is only the region of that Vd is higher than plane (1) defined by Vg−1=Vd. Additionally, using Vt=0.6 [v]+0.4 [v]=1 [v], sqrt(20×2/280.8)=0.3775 [v] and Vd=2.5 [v], then Vg<3.5 [v]. Therefore, the object region is defined as that Vg is lower than plane (2) defined by Vg=3.5.

By contrast, It is necessary that Va is higher than Vreset+Vf under the condition of that reset current Ireset(I=20) flows. This shows that Va is higher than plane (3) defined by Va=Vreset+Vf in FIG. 6. Further, it is required to satisfy Vg=Va+1<Vset+Vf+1 when current becomes zero (I=0). This shows that Va is lower than plane (4) defined by Va=Vset+Vf in FIG. 6.

Therefore, use Vreset+Vf=0.65+0.7 [v]=1.35 [v], and the following result will be obtained:

$$Vg=Va+1.3775>Vreset+Vf+1.3775=2.7275\ [v]$$

This shows that Vg is higher than plane (5) defined by Vg=Va+1.3775.

While, use Vset+Vf=1.5+0.7 [v]=2.2 [v], and the following result is obtained:

$$Vg=Va+1<Vset+Vf+1=3.2\ [v]$$

This shows that Vg is lower than plane (6) defined by Vg=Va+1.

As the overlap region of the above described conditions, there is provided a hatched region (this is a trapezoid region elongated infinitely in the Vd direction) as an allowable region (Vd, Vg) on the Vd−Vg plane. In this case, since saturation region is used, only that Vd is limited by the lowest value, and a center value and a width of Vg will be obtained.

In detail, the lower limit value of Vg is Vgmin=2.7275 [v]; the upper limit value is Vgmax=3.2 [v]; and width thereof is ΔVg=0.4725 [v].

Based on the above-described result, general solutions without detailed numbers substituted will be obtained below.

Expressions defining a region with higher Vd than plane (1) and another region with lower Vg than plane (2) are as follows:

$$Vg=\text{sqrt}(2I/K)+Va+Vt;\ Vg-Vt<Vd$$

The following expression defines a region with higher Va than plane (3):

$$Va(Ireset)>Vreset+Vf$$

The expression defining a region with lower Va than plane (4) is as follows:

$$Va(0)<Vset+Vf$$

When I=Ireset, the expression defining a region with higher Vg than plane (5) is as follows:

$$Vg=Va+Vt+\text{sqrt}(2Ireset/K)$$

When I=0, the expression defining a region with lower Vg than plane (6) is as follows:

$$Vg=Va+Vt+\Delta Vt$$

Further, the lower limit value Vgmin and the upper limit value Vgmax of Vg in the allowable region are expressed as follows:

$$Vgmin=Vreset+Vf+Vt+\text{sqrt}(2Ireset/K)$$

$$Vgmax=Vset+Vf+Vt+\Delta Vt$$

The center value Vg0 and width ΔVg of Vg are derived from the above-described results as follows:

$$Vg0=\{Vreset+Vset+\text{sqrt}(2Ireset/K)+\Delta Vt\}/2+Vf+Vt$$

$$\Delta Vg=Vset-Vreset-\text{sqrt}(2Ireset/K)+\Delta Vt$$

[Stabilization of Change to Set State]

Next, with reference to FIG. 7, it will be explained a method of automatically stabilizing the change to a set state of variable resistance element VR.

Figure 7:
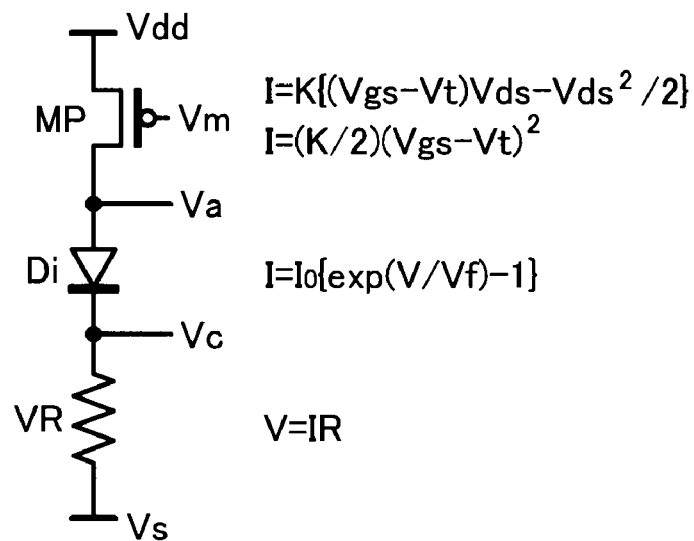
FIG. 7 shows a memory cell with a PMOS transistor attached for stabilizing the change to set state.

To prevent the variable resistance element VR from being restored to the reset state in accordance with current increasing after having changed to the set state (low resistance state) by voltage application, as shown in FIG. 7, P-channel MOS transistor (referred to as PMOS transistor hereinafter) MP is inserted in the current path of the memory cell having diode Di and variable resistance element VR. The gate and drain of PMOS transistor MP are set at Vm and Vdd, respectively. Vdd is a constant power supply voltage, which serves as a set and reset voltage source.

With this construction, by use of that the effective resistance value of transistor MP is changed in accordance with current flowing therein, it is controlled in such a state that reset current Ireset is not carried again even if variable resistance element VR is changed to a set state.

Figure 8:
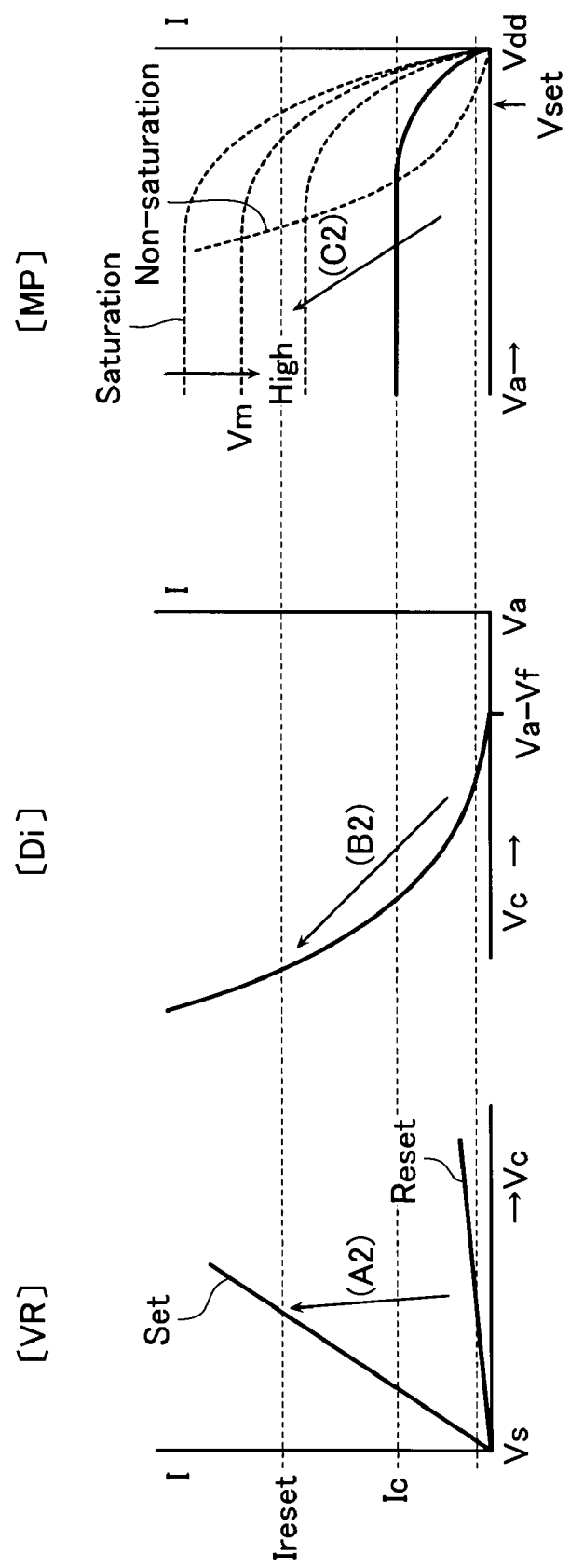
FIG. 8 shows the characteristics of the respective devices in FIG. 7.

FIG. 8 shows voltage-current characteristics of the variable resistance element VR, diode Di and PMOS transistor MP are arranged with the base potentials Vs, Va and Vdd (Vs<Va<Vdd), respectively, set on the lateral axis.

In FIG. 7, the general expressions of voltage-current characteristic used in common to NMOS transistor and PMOS transistor are shown. By use of voltages at the respective nodes in FIG. 7, the characteristic of PMOS transistor with threshold voltage −Vtp in the non-saturation region will be expressed as follows:

$$I=Kp\{(Vm-Vdd+Vtp)(Va-Vdd)-(Va-Vdd)^2/2;$$
$$Va\geq Vm+Vtp$$

By contrast, in case of the saturation region, the expression is as follows:

$$I=(Kp/2)(Vm-Vdd+Vtp)^2;\ Va<Vm+Vtp$$

The characteristic of diode Di is as follows:

$$I=I0\{\exp(Va-Vc)/Vf-1\};\ Va-Vc\geq Vf$$

The characteristic of variable resistance element VR is as follows:

$$I=(Vc-Vs)R$$

In FIG. 8, these voltage (V)–current (I) characteristics are shown in parallel on the lateral axis, on which the base voltages Vs, Va and Vdd are set. Shown on the vertical axis is the common current amount of the serially connected devices.

When variable resistance element VR is changed from the reset state to the set state with set voltage Vset applied (as shown by arrow A2), current of diode Di increases in accordance with that variable resistance element VR becomes a low resistance state (as shown by arrow B2), and drain node voltage Va is reduced (as shown by arrow C2). In this case, if gate voltage Vm is set a suitable level, and clamp current Ic is set at a certain level lower than the reset current Ireset, it becomes possible to avoid that the reset current Ireset flows again in the variable resistance element VR.

PMOS transistor MP goes into the saturation region, and the current depends on the gate voltage Vm when drain voltage Va is reduced. Therefore, the higher the gate voltage Vm is set, the less the current.

Therefore, Vdd is set to be higher than set voltage Vset when the variable resistance element VR is in a high resistance state while gate voltage Vm is set at such a level that when the variable resistance element VR is set in the set state with a low resistance and current starts to flow, it is limited to Ic sufficiently smaller than the reset current Ireset. As a result, when changing to the set state, Va (and Vc) is suppressed in level, so that restoring to the reset state does not occur. That is, the change to the set state will be self-controlled and stabilized passively.

So far, the methods of stabilizing the reset state and the set state of the variable resistance element VR have been explained independently. Next, in consideration of the both methods, detailed state-change stabilizing circuits will be explained.

[State-Change Stabilizing Circuit (1)]

Figure 9:
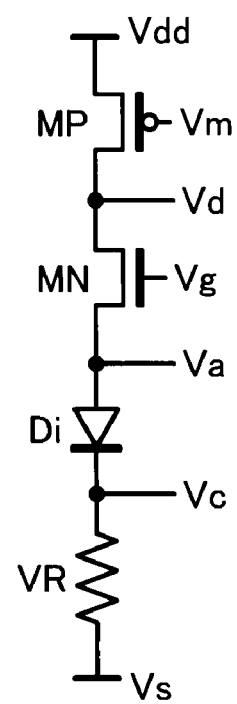
FIG. 9 shows a state change stabilizing circuit.

FIG. 9 shows an example of state-change stabilizing circuits. This stabilizing circuit includes NMOS transistor MN and PMOS transistor MP, which are coupled in series to diode Di on the anode side.

The source node of PMOS transistor MP is coupled to the power supply voltage node Vdd. Assuming that the common drain node of PMOS transistor MP and MNOS transistor MN is set at Vd, the gate of PMOS transistor MP is set at Vm, the gate of NMOS transistor MN is set at Vg, these voltages will be set at suitable values for stabilizing not only "change to reset state" but also "change to set state" in the variable resistance element VR.

The characteristic of the non-saturation region of PMOS transistor MP with threshold voltage −Vtp is expressed as follows:

$$I=Kp\{(Vm-Vdd+Vtp)(Vd-Vdd)-(Vd-Vdd)^2/2\};$$
$$Vd\geq Vm+Vtp$$

The saturation region is expressed as follows:

$$I=(Kp/2)(Vm-Vdd+Vtp)^2;\ Vd<Vm+Vtp$$

The characteristic of NMOS transistor with threshold voltage Vt in the non-saturation region will be expressed as follows:

$$I=K\{(Vg-Va-Vt)(Vd-Va)-(Vd-Va)^2/2\}; Vg-Vt \geq Vd$$

The saturation region is expressed as follows:

$$I=(K/2)(Vg-Va-Vt)^2; Vg-Vt<Vd$$

The characteristics of diode Di and variable resistance element VR are the same as shown in FIG. 7.

To stabilize the change to the set state, the current clamping function in the saturation region of PMOS transistor MP is used under the condition that NMOS transistor MN is set in a non-saturation state (i.e., Vg−Vt≧Vd) with a sufficiently low resistance with Vg set to be high. In detail, Vm is set at high, so that the current of the saturation region of PMOS transistor MP is set to be sufficiently small (i.e., Vd<Vm+Vtp). This means that the current of PMOS transistor MP is set to be sufficiently less than the reset current Ireset. As a result, the change to the set state will be stabilized based on the above-described principle.

To stabilize the change to the reset state, PMOS transistor MP is set in the non-saturation region (i.e., Vd≧Vm+Vtp) with a sufficiently low resistance with Vm set to be low, so that Vd change is set to be less. While, NMOS transistor MN is set in the saturation region (i.e., Vg−Vt<Vd) with Vg set to be low, so that the source voltage change is suppressed under a certain level. As a result, even if the reset state is obtained, the applied voltage of the variable resistance element VR will be limited to be lower than set voltage Vset.

Figure 10:
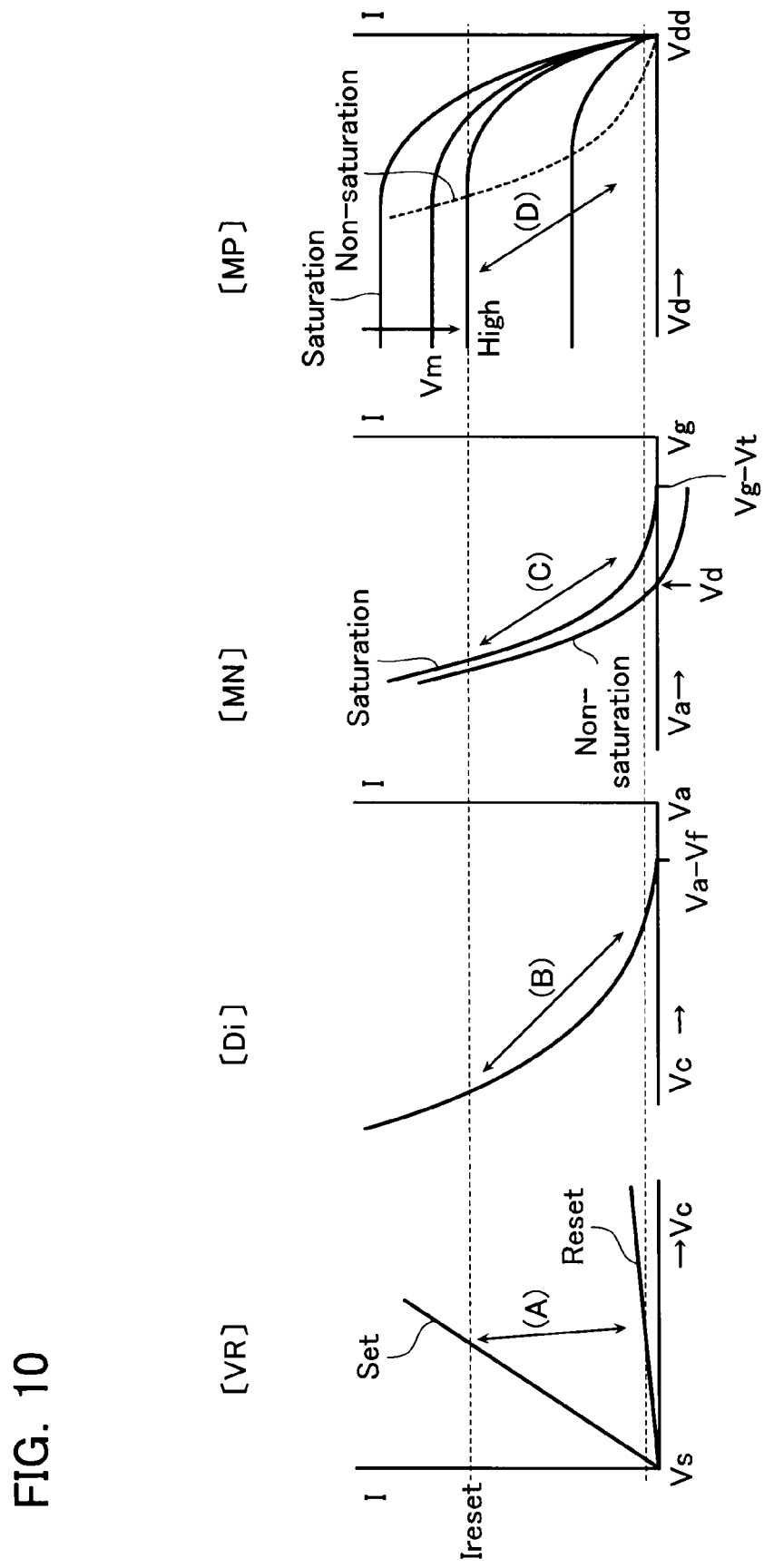
FIG. 10 shows the characteristics of the respective devices in FIG. 9.

FIG. 10 shows the state-changes of the variable resistance element VR, diode Di, NMOS transistor MN and PMOS transistor MP with arrows A, B, C and D in the above-described set and reset operations.

[State-Change Stabilizing Circuit (2)]

Figure 11:
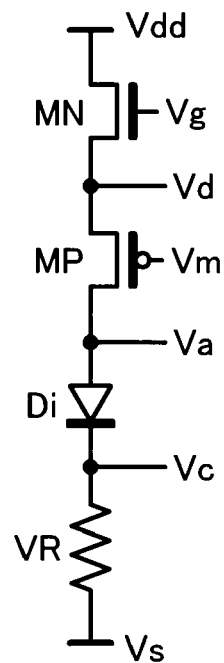
FIG. 11 shows another state change stabilizing circuit.
Figure 12:
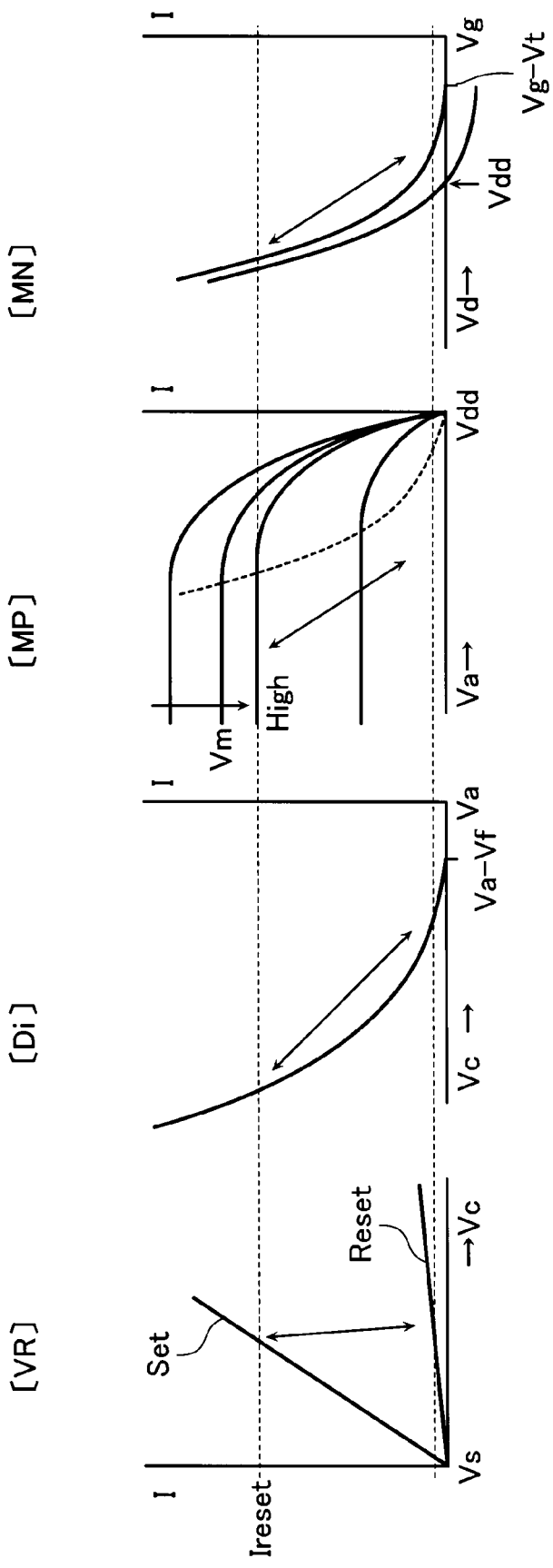
FIG. 12 shows the characteristics of the respective devices in FIG. 11.

FIG. 11 shows another state-change stabilizing circuit, in which the arrangement order of NMOS transistor MN and PMOS transistor MP is reversed to that in FIG. 9, i.e., NMOS transistor MN is disposed on the Vdd side. The same stabilizing operation is performed as the above-described example. This is apparent from the state changes shown in FIG. 12.

The characteristic of the non-saturation region of NMOS transistor MN is expressed as follows:

$$I=K\{(Vg-Vd-Vt)(Vdd-Vd)-(Vdd-Vd)^2/2\}; Vg-Vt \geq Vdd$$

The saturation region is expressed as follows:

$$I=(K/2)(Vg-Vd-Vt)^2; Vg-Vt<Vdd$$

The characteristic of PMOS transistor MP in the non-saturation region will be expressed as follows:

$$I=Kp\{(Vm-Vd+Vtp)(Va-Vd)-(Va-Vd)^2/2\}; Va \geq Vm+Vtp$$

The saturation region is expressed as follows:

$$I=(Kp/2)(Vm-Vd+Vtp)^2; Va<Vm+Vtp$$

Note here in this case that to make PMOS transistor MP operate in the non-saturation region with a sufficiently low resistance, it may be required to set the gate voltage Vm to be negative in correspondence to threshold voltage Vtp. Therefore, to make PMOS transistor MP operate in the non-saturation region (i.e., linear region) with a sufficiently low resistance, the connection method shown in FIG. 9 is effective.

Further, it is not always required of these transistors MP and MN to be directly coupled in series, but it is allowed that the respective current paths are serially arranged.

[Stabilization of Change to Reset State—Part 2]

FIG. 3 shows a method of stabilizing the change to reset state with NMOS transistor MN disposed on the higher level side of the memory cell (i.e., on the Vd side). By contrast, it is possible to stabilize the change to reset state with PMOS transistor MP. In this case, the device arrangement will be different from that shown in FIG. 3.

Figure 13:
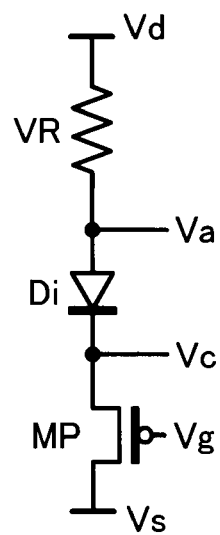
FIG. 13 shows another method of state change stabilization of the change to reset state.

As shown in FIG. 13, variable resistance element VR is disposed on the higher level (Vd) side; PMOS transistor MP is disposed on the lower level (Vss) side; and diode Di is inserted therebetween.

Explaining in brief, if variable resistance element VR becomes a high resistance in the reset mode, the cathode voltage Vc of diode Di (i.e., the source voltage of MP) is reduced, thereby resulting in that the channel resistance of MP becomes high. Therefore, the anode voltage Va is not extremely reduced, and this prevents variable resistance element VR from being applied with the set voltage Vset.

[Stabilization of Change to Set State—Part 2]]

FIG. 7 shows a method of stabilizing the change to set state with PMOS transistor MP disposed on the power supply node (Vdd) side. By contrast, it is possible to stabilize the change to set state with NMOS transistor MN. In this case, the device arrangement will be different from that shown in FIG. 7.

Figure 14:
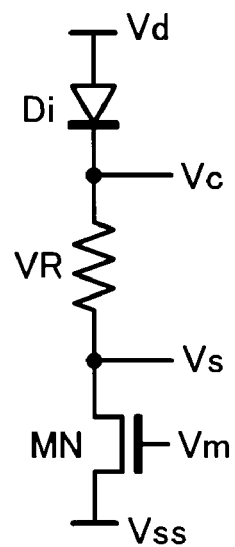
FIG. 14 shows another method of state change stabilization of the change to set state.

As shown in FIG. 14, diode Di is disposed on the higher level (Vd) side; NMOS transistor MN is disposed on the ground level (Vss) side; and variable resistance element VR is inserted therebetween.

Figure 15:
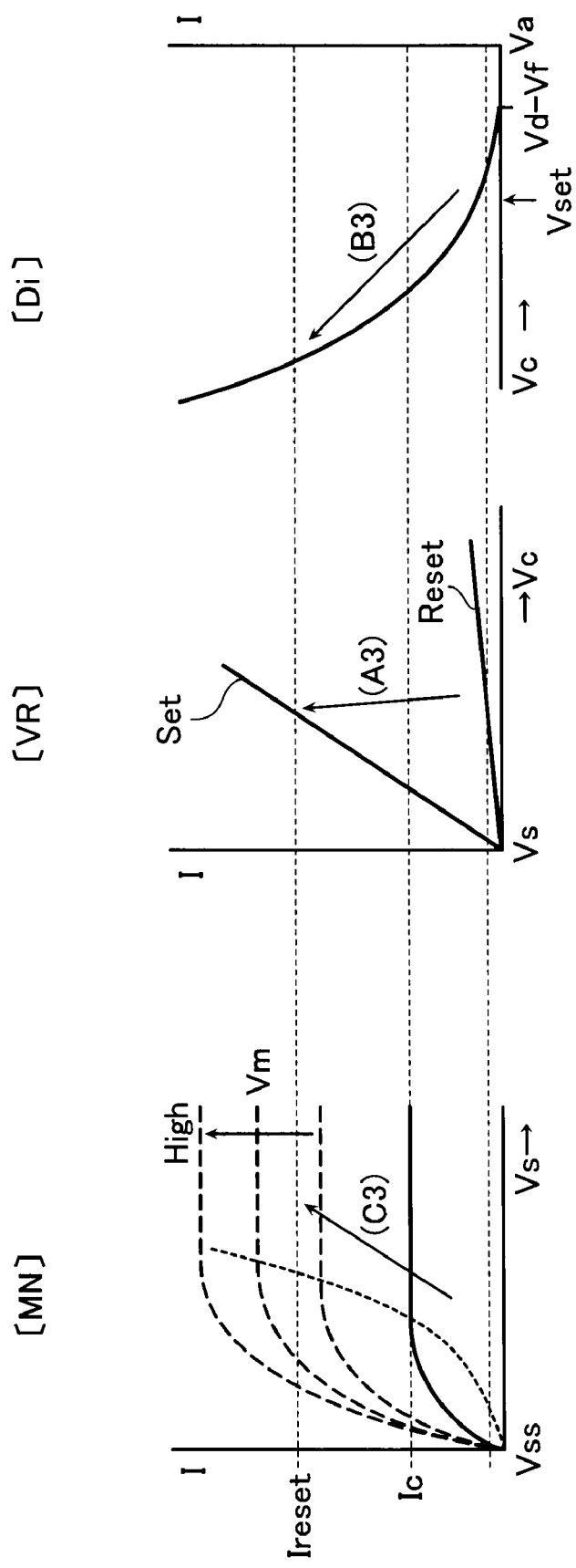
FIG. 15 shows the characteristics of the respective devices in FIG. 14.

FIG. 15 shows the characteristics of NMOS transistor MN, variable resistance element VR and diode Di arranged in parallel on the lateral axis with the respective base potentials.

The characteristic of the non-saturation region of NMOS transistor MN is expressed as follows:

$$I=K\{(Vm-Vss-Vt)(Vs-Vss)-(Vs-Vss)^2/2\}; Vm-Vt \geq Vs$$

The saturation region is expressed as follows:

$$I=(K/2)(Vm-Vss-Vt)^2; Vm-Vt<Vs$$

The characteristic of diode Di is as follows:

$$I=I0\{\exp(Vd-Vc)/Vf-1\}; Vd-Vc \geq Vf$$

The characteristic of variable resistance element VR is as follows:

$$I=(Vc-Vs)R$$

When making variable resistance element VR held in the reset state change to the set state with applying set voltage Vset (as shown by arrow A3), current of diode Di increases in accordance with the resistance reduction of variable resistance element VR (as shown by arrow B3), thereby resulting in that cathode voltage Vs of diode Di (i.e., drain voltage of transistor MN) is boosted (as shown by arrow C3). At this time, assuming that the gate voltage Vm is set at a suitable value, and clamping current Ic is set lower than reset current Ireset, it is possible to prevent the variable resistance element VR from being carried with the reset current Ireset.

That is, the drain voltage Vs of NMOS transistor MN depends on the current, and if Vs is boosted, NMOS transistor MN goes into the saturation region. In this case, the transistor current depends on the gate voltage Vm. That is, the lower the gate voltage Vm is set, the less the current.

Therefore, when variable resistance element VR is set in the set state, i.e., in a low resistance state, and current starts to flow, suppress the current, and set the gate voltage Vm to make the transistor be carried with sufficiently less current than the reset current Ireset. As a result, voltage Vs is boosted, and the voltage difference between Vc and Vs is suppressed, so that the change to reset state does not occur, i.e., the change to set state may be automatically stabilized.

[State-Change Stabilizing Circuit (3)]

Figure 16:
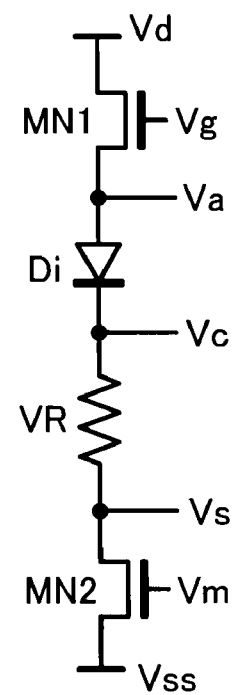
FIG. 16 shows another state change stabilizing circuit.

FIG. 16 shows still another state-change stabilizing, which is formed of only NMOS transistors. NMOS transistors MN1 and MN2 serving as state stabilizing devices are coupled in series to the memory cell (diode Di and variable resistance element VR) in such a manner as to sandwich the memory cell. The gate voltages Vg and Vm of NMOS transistors MN1 and MN2 are suitably and independently set in correspondence to "change to set state" and "change to reset state". As a result, both of these state-changes may be stabilized.

The characteristic of NMOS transistor MN1 disposed on the high level side (Vd side) is expressed in case of the non-saturation region as follows:

$$I=K\{(Vg-Va-Vt)(Vd-Va)-(Vd-Va)^2/2\}; Vg-Vt \geq Vd$$

While, in case of saturation region, the characteristic of NMOS transistor MN1 is expressed as follows:

$$I=(K/2)(Vg-Va-Vt)^2; Vg-Vt<Vd$$

The characteristic of NMOS transistor MN2 disposed on the low level side (Vss side) is expressed in case of the non-saturation region as follows:

$$I=K\{(Vm-Vss-Vt)(Vs-Vss)-(Vs-Vss)^2/2\}; Vm-Vt \geq Vs$$

While, in case of saturation region, the characteristic of NMOS transistor MN2 is expressed as follows:

$$I=(K/2)(Vm-Vss-Vt)^2; Vm-Vt<Vs$$

Diode Di and variable resistance element VR have the same characteristics as those shown in FIG. 9.

Figure 17:
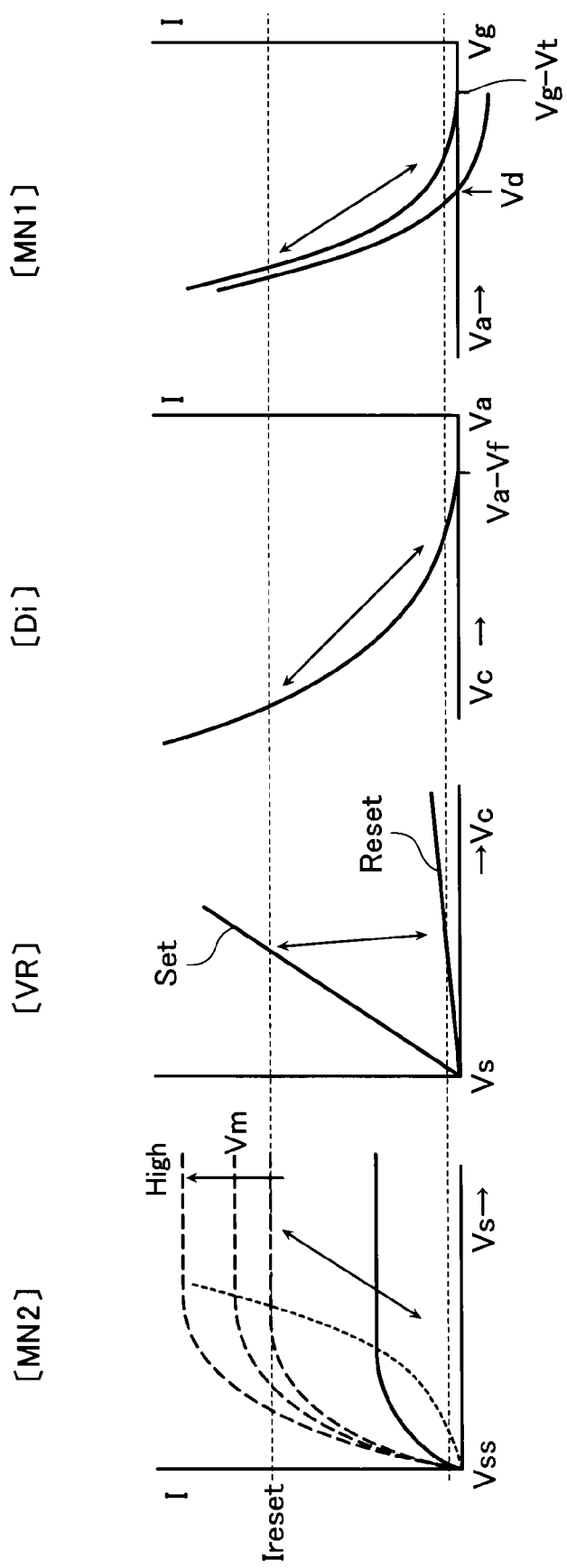
FIG. 17 shows the characteristics of the respective devices in FIG. 16.

FIG. 17 shows the state changes on the respective device characteristics. In case of change to a set state, NMOS transistor MN1 is set in a non-saturation state with a sufficiently low resistance with a high gate voltage Vg applied while NMOS transistor MN2 is set in such a saturation region that current is limited to be sufficiently less than the reset current Ireset with a low gate voltage Vm applied. With this current clamping, the change to the set state will be stabilized.

In case of change to a reset state, apply a higher gate voltage Vm, and transistor MN2 is set in a non-saturation region with a sufficiently low resistance, so that voltage change of Vs is suppressed. While, apply a lower gate voltage Vg, and transistor MN1 is set in a saturation region. As a result, the applied voltage of variable resistance element VR is kept lower than the set voltage Vset even if it is reset.

As explained above, with respect to the state-change stabilizing circuit for automatically stabilizing the state-change of variable resistance element VR, there are many variations in accordance with how to combine MOS transistors to be connected in series to the memory cell. While, in case of 3-D ReRAM, in which multiple cell arrays are stacked three-dimensionally, a cross-point cell is formed between each word line and bit line as a serial circuit of diode Di and variable resistance element VR. Therefore, in case diode leakage current increases in a bad cell, the stabilizing circuit scheme should be decided in consideration of the leakage current detour.

The influences of cross-fails on the set and reset operations of 3-D cell array ReRAM will be explained below.

[Influence of Cross-Fails on the Set Operation]

Figure 18:
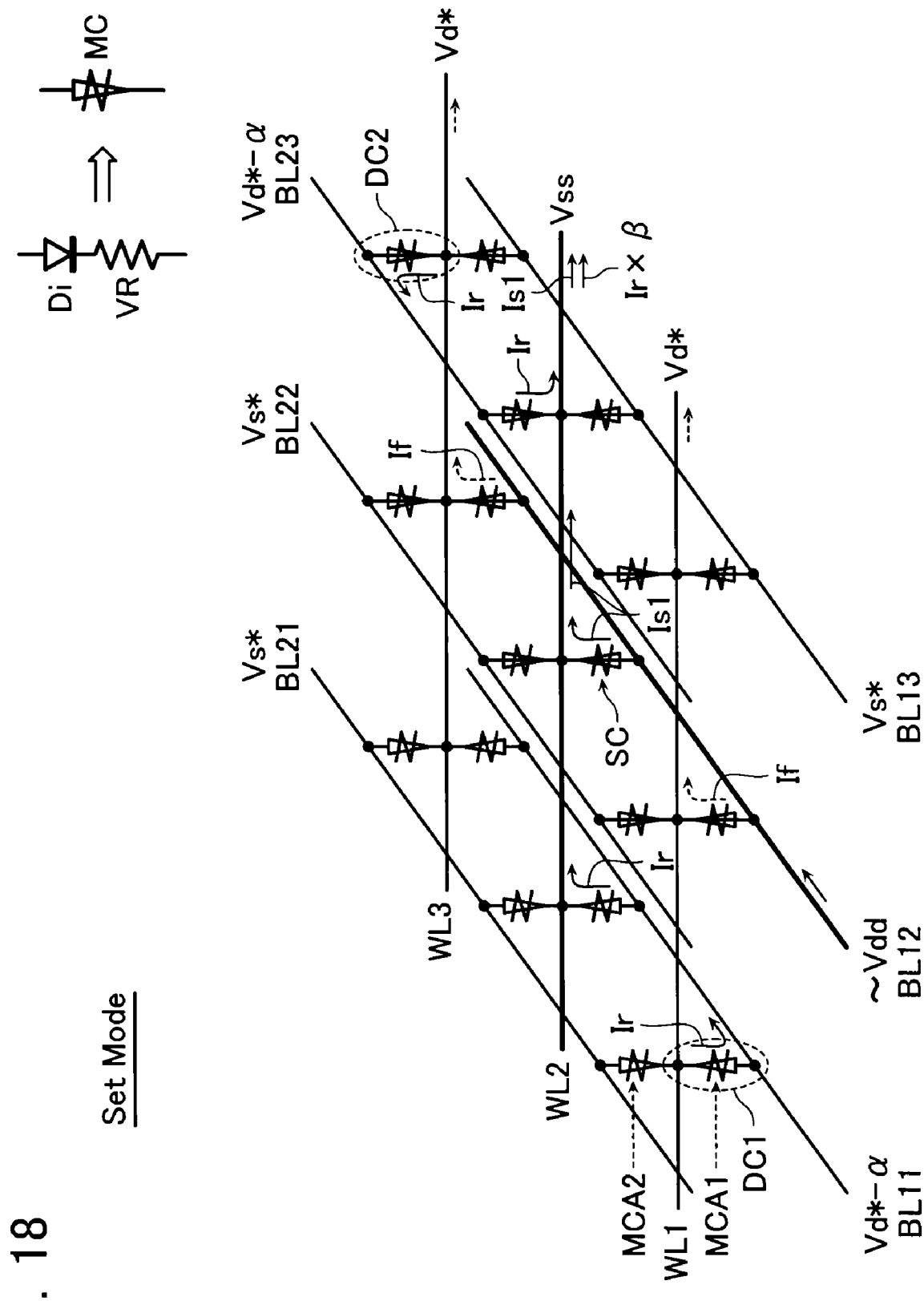
FIG. 18 is a diagram for explaining the influence of cross-fails in a set mode.

FIG. 18 shows an equivalent circuit of a 3-D cell array, in which two cell arrays MCA1 and MCA2 stacked with common word lines WL (WL1, WL2, WL3) are sampled. With reference to FIG. 18, the influence of cross-fails on the set operation will be explained.

It is assumed here that signal lines coupled to anodes of diodes Di are referred to as bit lines BL while signal lines coupled to cathodes of diodes Di are referred to as word lines WL. Memory cell MC formed of diode Di and variable resistance element VR connected in series is expressed by a symbol shown in FIG. 18.

The selection condition at a set time is as follows: a cross-point cell between a selected bit line BL12 and a selected word line WL2 is a selected cell SC, and selected bit line BL12 is set at Vdd while selected word line WL2 is set at Vss. As a result, cell current Is1 flows from the selected bit line BL12 to the selected word line WL2 via the selected cell SC.

The remaining bit lines are set at Vs* higher than the ground level Vss by about forward voltage drop Vf of diode Di while the remaining word lines are set at Vd* lower than the power supply level Vdd by about forward voltage drop Vf. Vdd has such a level as to generate a voltage necessary for setting the memory cell in a set state. The reason of why Vs* and Vd* are used is: for suppressing the reverse bias voltage of unselected memory cells, thereby reducing the total leakage current of the unselected cells; and for suppressing the forward voltage applied to unselected cells between the selected bit line and unselected word lines.

As the method of measuring the cross-fails, word line level is set strongly with sufficiently low impedance; and a bit line coupled to a bad cell (i.e., bad bit line) is set to be floating.

In the example shown in FIG. 18, it is assumed that cross-point cell, DC1, disposed between bit line BL11 and word line WL1 on the cell array MCA1 and cross-point cell, DC2, disposed between bit line BL23 and word line WL3 on the cell array MCA2 are bad cells. Bad bit lines BL11 and BL23 are set to be floating in this case.

In this case, selected cell SC does not share the selected word line and selected bit line with two bad cells DC1 and DC2 with large leakage current. The influence of the cross-fails on the set operation is as follows.

Bit lines coupled to bad cells DC1 and DC2 are set to be floating, so that these bit lines are charged up to Vd*−α slightly lower than Vd* due to leakage current Ir flowing in the bad cells DC1, DC2. From the selected bit line BL12 to unselected word lines WL1 and WL3, a little forward current If flows because the limit forward bias voltage of about Vdd−Vd* is applied to the diodes. However, there is no current or voltage disturbance for the selected cell SC. Therefore, the set operation is not problematic.

On the selected word line WL2, not only current Is1 flowing in the selected cell SC but also the total sum, Ir×β, of leakage current Ir of the bad cells DC1 and DC2 flow. If a current detecting circuit or device is coupled to this word line, there is a probability of generating an erroneous operation. Therefore, it becomes material that the word line voltage Vss is set certainly with sufficiently low impedance as explained above.

Bit lines are applied only with voltage in the set operation, and the bit line current is automatically clamped in accordance with current increase due to resistance reduction of variable resistance element VR. Therefore, bit line voltage is automatically lowered, so that forward current into the unselected word lines will be lost. With respect to bit lines, there is no influence of cross-fails on the set operation.

[Influence of Cross-Fails on the Reset Operation]

Figure 19:
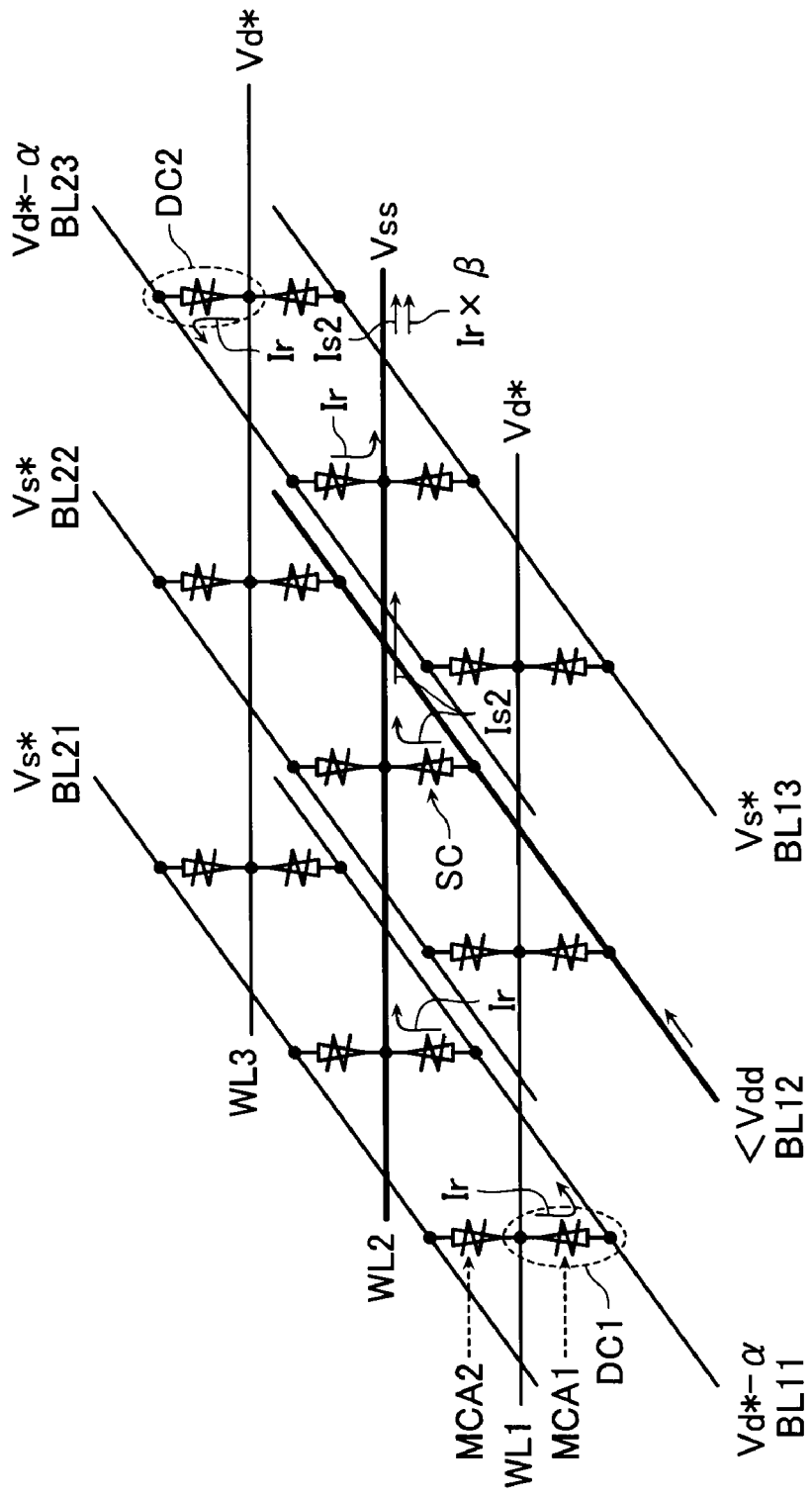
FIG. 19 is a diagram for explaining the influence of cross-fails in a reset mode.

Next, with reference to FIG. 19, the influence of cross-fails on the reset operation will be explained. There are bad cells DC1 and DC2, and a selected cell SC in the 3-D cell array as well as the case shown in FIG. 18. What is different in a reset mode from the select conditions in the set mode is that reset-use voltage applied to the selected bit line is lower than the set-use voltage. Excepting this, others are the same as in the set mode.

Although unselected word lines are applied with Vd*; and unselected bit lines with Vs*, bit lines BL11, BL23 coupled to bad cells DC1, DC2 are set to be slightly lower than Vd*, i.e., Vd*−α, because these are set to be floating. The selected bit line BL12 is lower than Vdd, and unselected word lines are set at Vd*, so that diodes in cells therebetween are kept off. In the selected cell, there is no disturbance generated with voltage and current. Therefore, there is no problem in the reset operation.

On the selected word line WL2, not only current Is2 flowing in the selected cell SC but also the total sum, Ir×β, of leakage current Ir of the bad cells DC1 and DC2 flow. If a current detecting circuit or device is coupled to this word line, there is a probability of generating an erroneous operation. Therefore, it becomes material that the word line voltage Vss is set certainly with low impedance as explained above.

Bit lines are initially applied current in the reset operation, and the bit line voltage is automatically limited under Vdd in accordance with current decrease due to resistance increase of variable resistance element VR. Therefore, with respect to bit lines, there is no influence of cross-fails on the reset operation.

[Influence of Cross-Fails on the Read Operation]

Figure 20:
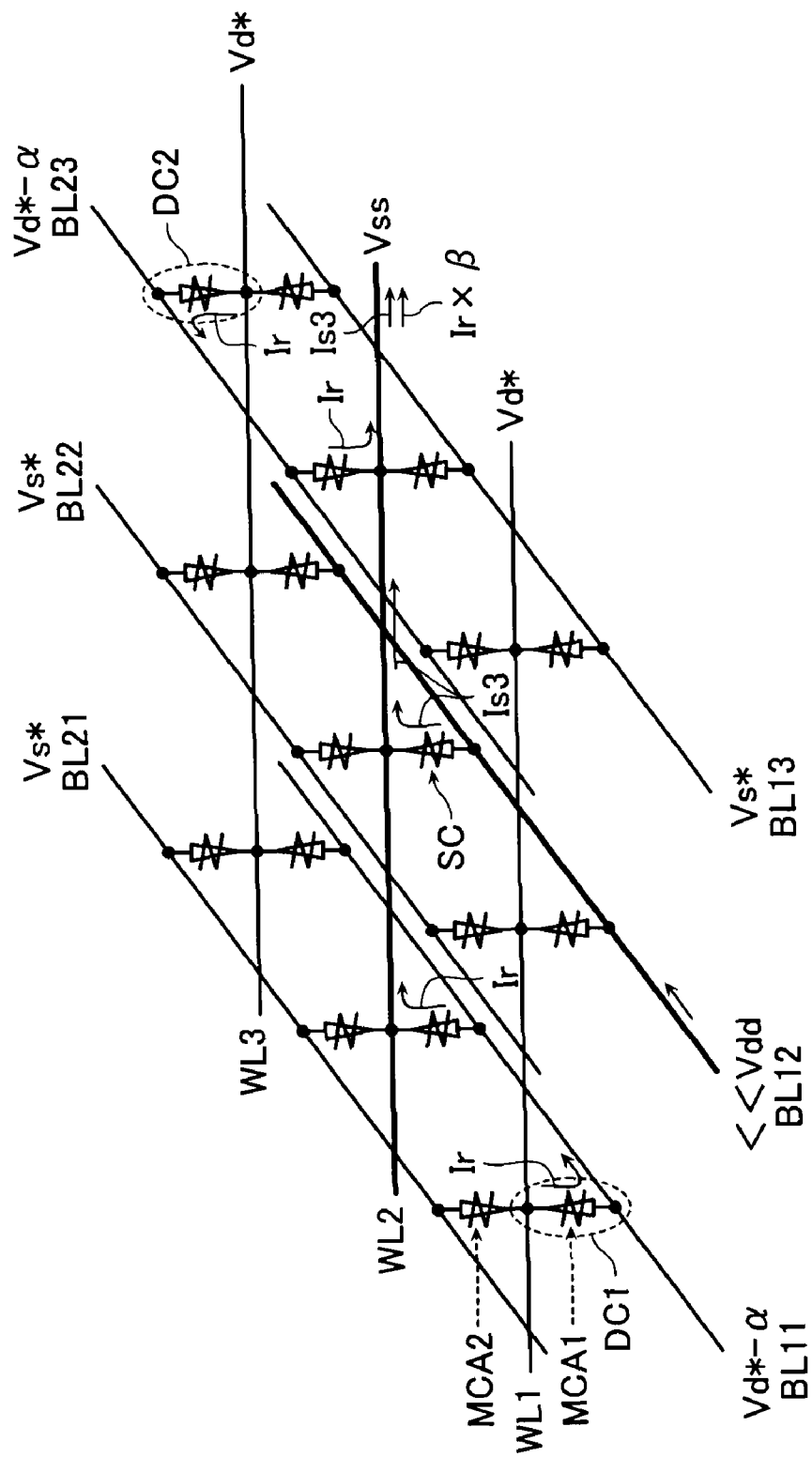
FIG. 20 is a diagram for explaining the influence of cross-fails in a read mode.

Next, with reference to FIG. 20, the influence of cross-fails on the read operation will be explained. There are bad cells DC1 and DC2, and a selected cell SC in the 3-D cell array as well as the case shown in FIGS. 18 and 19. What is different in a read mode from the select conditions in the set or reset mode is that the selected bit line is applied with a read voltage sufficiently lower than Vdd. Excepting this, others are the same as in the set or reset mode.

Although unselected word lines are applied with Vd*; and unselected bit lines with Vs*, bit lines BL11, BL23 coupled to bad cells DC1, DC2 are set to be slightly lower than Vd*, i.e., Vd*−α, because these are set to be floating. The selected bit line BL12 is lower than Vdd, and unselected word lines are set at Vd*, so that diodes in cells therebetween are kept off. In the selected cell, there is no disturbance generated with voltage and current.

On the selected word line WL2, not only current Is3 flowing in the selected cell SC but also the total sum, Ir×β, of leakage current Ir of the bad cells DC1 and DC2 flow. If a current detecting circuit or device is coupled to this word line, there is a probability of generating an erroneous operation. Therefore, it becomes material that the word line voltage Vss is set certainly with low impedance as explained above.

In the selected bit line, a little current is carried in the read mode, and amount thereof will be sensed. There is no influence of cross-fails on the read operation.

[Influence of Cross-Fails on the Standby State]

Figure 21:
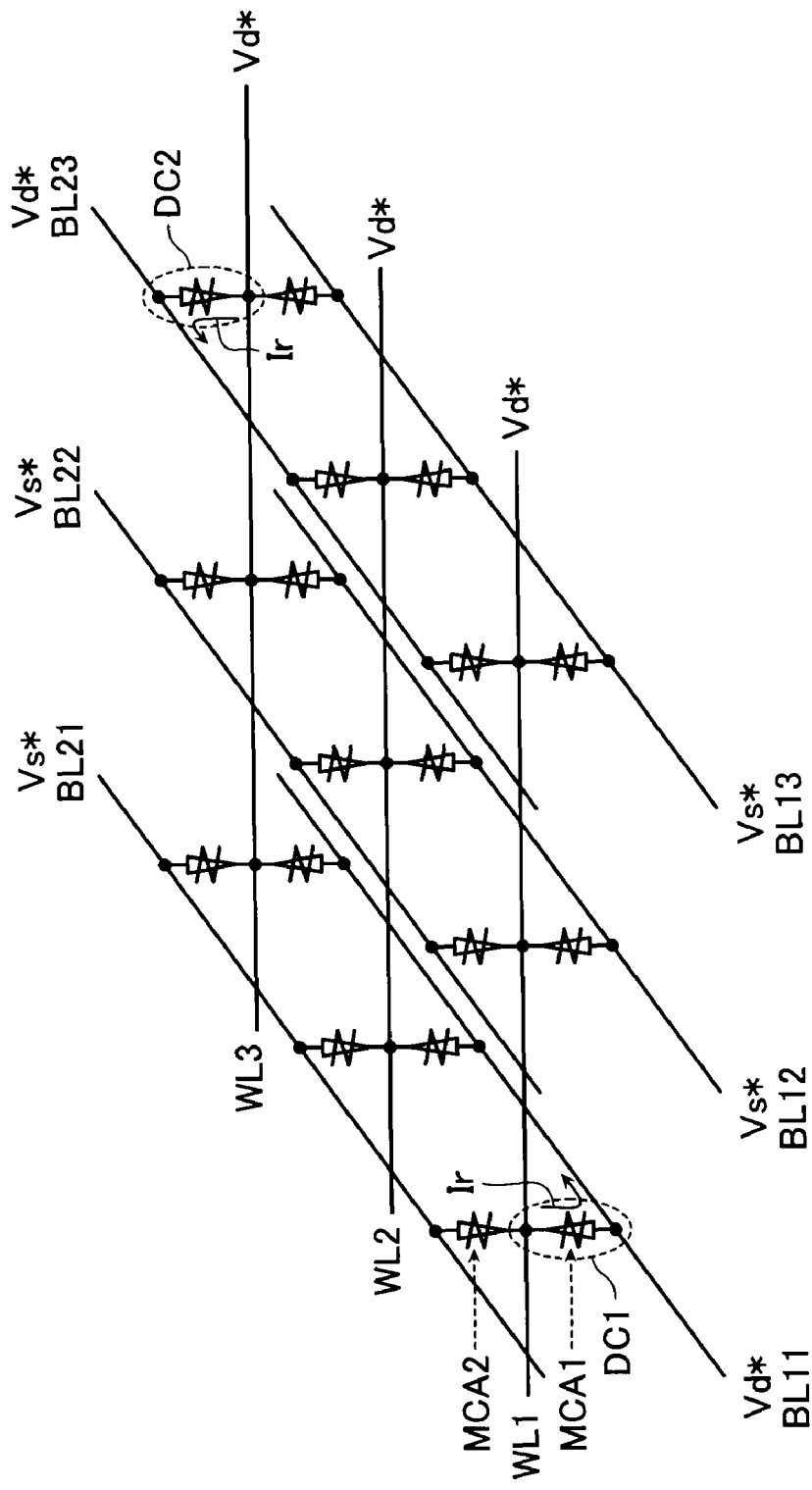
FIG. 21 is a diagram for explaining the influence of cross-fails in a standby mode.

Next, with reference to FIG. 21, the influence of cross-fails on the standby state will be explained. There are bad cells DC1 and DC2 in the 3-D cell array as well as the case shown in FIGS. 18-20. In the standby state, all word lines are set at Vd*; all bit lines at Vs*; and bad bit lines coupled to bad cells DC1, DC2 floating. Under this condition, bad bit lines are charged up to Vd* with leakage current Ir.

There in no diodes forward-biased, so that there is no problem in the standby state.

[Influence of Bad Cells Between Cell Array Layers]

Next, with respect to a selected cell in the 3-D cell array, it will be examined which layer separated from the selected cell has influences on the selected cell.

Figure 22:
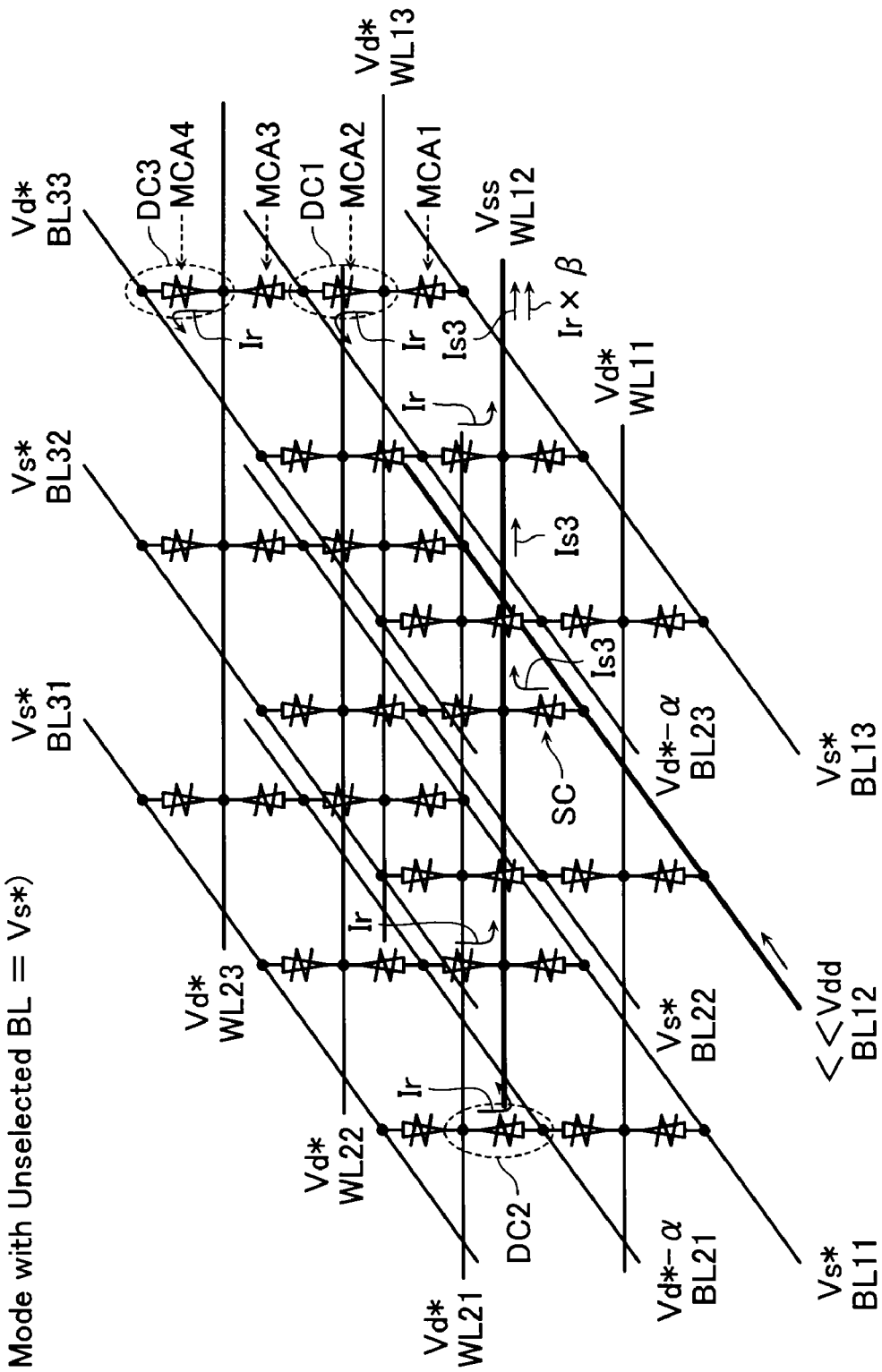
FIG. 22 is a diagram for explaining the influence of cross-fails in multiple cell arrays stacked.

FIG. 22 shows an example of four layers MCA1 to MCA4 in a 3-D cell array. Word lines WL1 (WL11, WL12, WL13, . . . ) of a first layer are shared by first cell array MCA1 and second cell array MCA2. Word lines WL2 (WL21, WL22, WL23, . . . ) of a second layer are shared by third cell array MCA3 and fourth cell array MCA4. Bit lines BL2 (BL21, BL22, BL23, . . . ) of a second layer are shared by second cell array MCA2 and third cell array MCA3.

Assuming that there are bad cells with large leakage, DC1, DC2 and DC3, in the second, third and fourth cell arrays MCA2, MCA3 and MCA4, respectively, the read operation of a selected cell SC coupled to selected bit line BL12 and selected word line WL12 (shown with bold lines) in the lowermost cell array MCA1 will be examined.

The selected word line WL12 is applied with Vss; selected bit line BL12 with a voltage sufficiently lower than Vdd; unselected word lines with Vd*; and unselected bit lines with Vs*. Although bad bit lines BL12, BL23 and BL33 are set in a floating state, BL21 and BL23 are set at Vd*−α slightly lower than Vd* due to leakage current Ir flowing via bad cells DC1 and DC2. Another bad bit line BL33 of the uppermost cell array MCA4 is charged up by leakage current Ir of bad cell DC3, but there is not formed a current path coupled to the selected word line, so that the bit line level is kept at Vd*.

Since selected bit line BL12 is sufficiently lower than Vdd and unselected word lines are set at Vd* higher than the selected bit line, cells therebetween are reversely biased, so that diodes thereof are kept off. Therefore, in the selected cell, there is no disturbance generated with voltage and current.

On the selected word line WL12, not only current Is3 flowing in the selected cell SC but also the total sum, Ir×β, of leakage current Ir from the cross-fails flow. If a current detecting circuit or device is coupled to this word line, there is a probability of generating an erroneous operation. In the selected bit line, a little current is carried in the read mode, and amount thereof will be sensed. There is no disturbance due to current from the cross-fails.

The leakage current from bad bit lines to the selected word line is generated between Vd* and Vss, and increases in proportion to the number of bad cells in the upper and lower two cell arrays. Therefore, it is desired in a read mode that the selected word line is strongly set at Vss with low output impedance.

To simplify the decoder circuit, it is desirable to simplify the voltage level setting for signal lines. As described above, bad bit lines are set to be floating. Therefore, if the access cycle is short, it is no problem to set all bit lines excepting the selected bit line to be floating.

Figure 23:
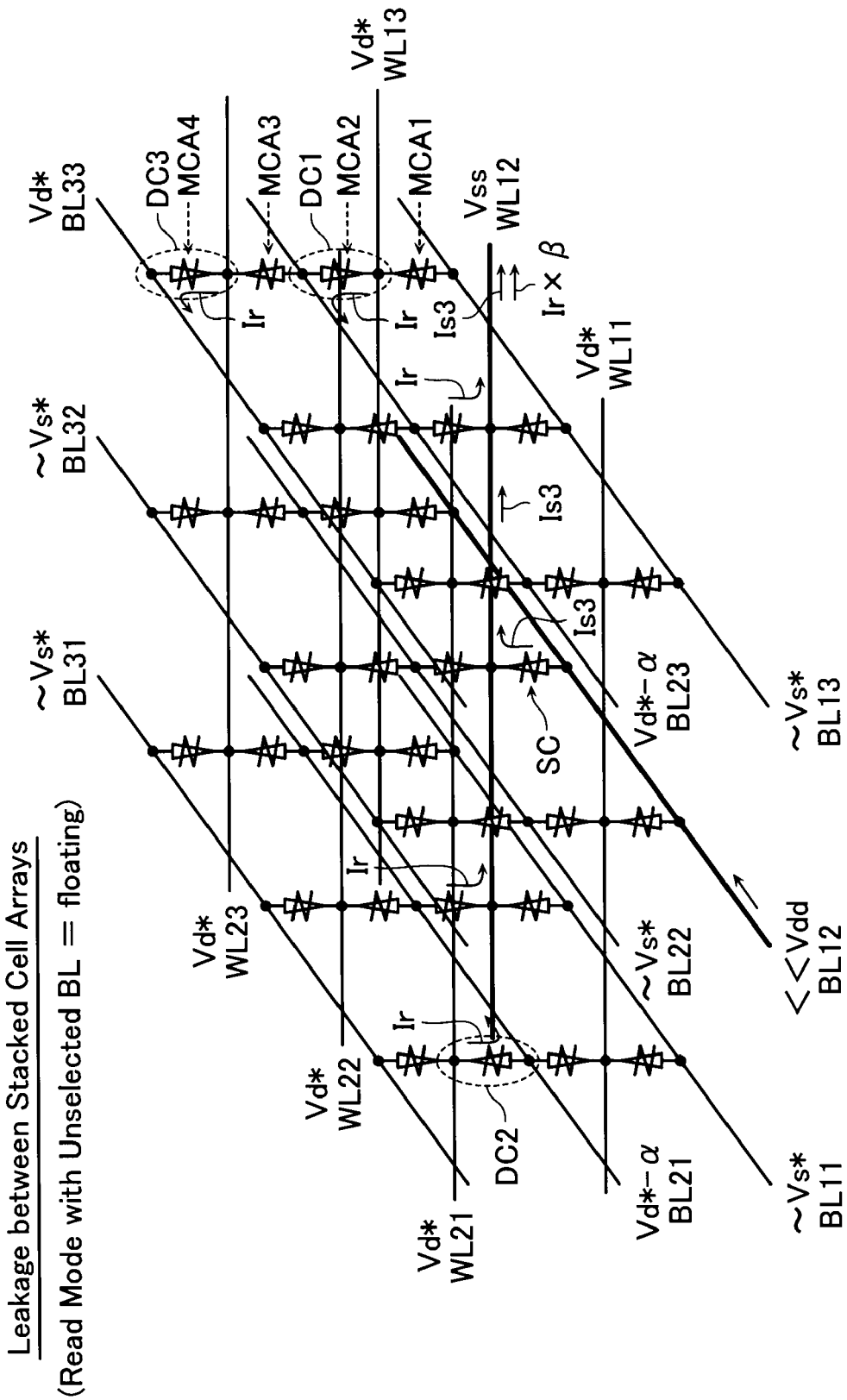
FIG. 23 is a diagram for explaining the influence of cross-fails in multiple cell arrays stacked in case unselected bit lines are set floating.

So, with reference to FIG. 23, with respect to such a case that unselected bit lines are set in a floating state, the influence of cross-fails on the read operation will be examined. FIG. 23 shows the same 3-D cell array, the same bad cell distribution and selection condition as in FIG. 22. Unselected bit lines are fixedly set at Vs* in FIG. 22 while these are set to be floating in FIG. 23. The floating level is expressed by "~Vs*".

Selected word line WL12 (shown by a bold line) is set at Vss; selected bit line BL12 (shown by a bold line) at a sufficiently lower voltage than Vdd; and unselected word lines at Vd*. Unselected bit lines are set to be floating, but the level will be kept at about Vs* (i.e., ~Vs*) because the selection time is short.

In the bad bit lines BL21, BL23 and BL33, BL21 and BL23 are set at Vd*−α slightly lower than Vd* due to leakage current via bad cells while BL33 of the uppermost cell array is set at Vd*.

Cells between selected bit line BL12 and unselected word lines are reversely biased, so that diodes thereof are kept off.

The remaining unselected bit lines all are set at about Vs*. Therefore, in the selected cell, there is no disturbance generated with voltage and current.

On the selected word line WL12, not only current Is3 flowing in the selected cell SC but also the total sum, Ir×β, of leakage current Ir flow from the cross-fails in the upper and lower two cell arrays. If a current detecting circuit or device is coupled to this word line, there is a probability of generating an erroneous operation. In the selected bit line BL12, a little current Is3 is carried in the read mode, and amount thereof will be sensed. There is no disturbance due to current from the cross-fails.

The leakage current from bad bit lines is generated between Vd* and Vss, and increases in proportion to the number of bad cells in the upper and lower two cell arrays. Therefore, it is desired in a read mode that the selected word line is strongly set at Vss with low impedance. This is as well as the case that unselected word lines are set at Vs*. Even if unselected bit lines are boosted in level due to the coupling from the selected bit line, it will be absorbed as driving current of the selected word line, and does not influence on the selected bit line.

In consideration of the above-described situation of the influence of cross-fails, it will be understood that it is necessary to dispose the voltage and current control circuits on the bit line side. This is because of that the leakage current of cross-fails influences on the word line side, and it is required of word lines to be kept at a level with low impedance.

[Voltage-Current Control System—in Case Bit Line is Located on the Anode Side of Cell Diode]

Figure 24:
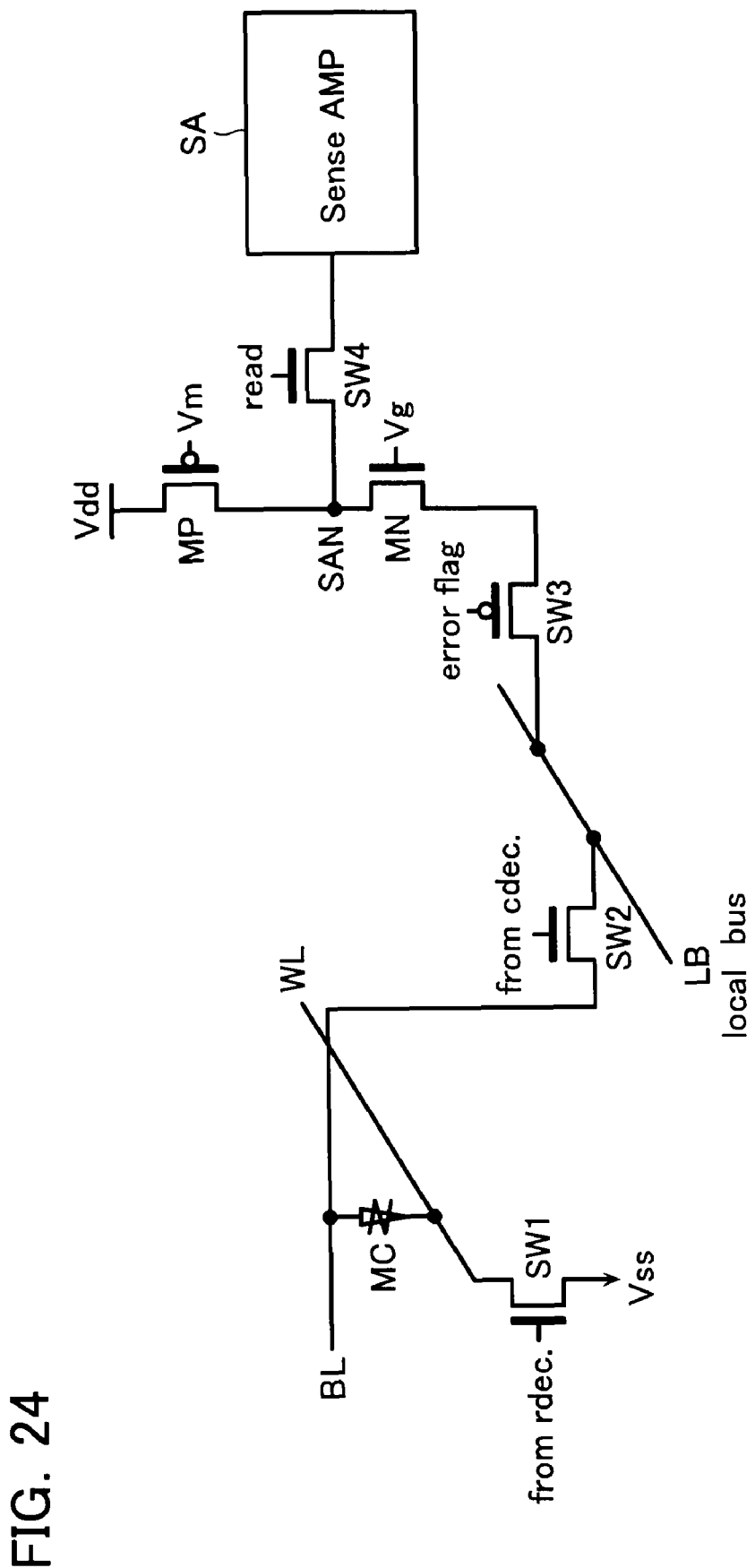
FIG. 24 shows select circuits around the sense amplifier in case the signal lines on the anode side of cell diode serve as bit lines.

FIG. 24 shows a voltage-current control system around the sense amplifier SA, which automatically stabilizes the state-change of variable resistance element VR in a selected cell in the above-described cross-point type of cell array with bit lines located on the anode side of cells.

Bit line BL is coupled to local bus LB via bit line switch SW2, which is a column gate switch with NMOS transistor driven by column decode signal "from cdec." higher than Vdd+Vt. With this configuration, a selected bit line is coupled to local bus LB without voltage drop.

Word line WL is selectively coupled to ground potential Vss via word line switch SW1, which is a row decode gate with NMOS transistor driven by row decode signal "from rdec.". With this configuration, a selected word line is coupled to Vss.

Local bus LB is coupled to sense node SAN via isolating switch SW3 driven by an error flag "error flag" and state-change stabilizing NMOS transistor MN driven by gate voltage Vg. The sense node SAN is further coupled to the power supply node Vdd via state-change stabilizing PMOS transistor MP with gate voltage Vm applied.

Switch SW3 is a PMOS transistor serving for separating the local bus LB to be selectively coupled to some bit lines from the read and write circuit system. That is, in case there are cross-fails in the bit lines coupled to the local bus LB, gate signal "error flag" applied to this PMOS transistor is set at Vdd, so that the local bus LB will be separated from the read and write circuit system.

Sense node SAN is coupled to the sense amplifier SA via read switch SW4. Sense amplifier SA is one possible to detect a small current difference.

PMOS transistor MP and NMOS transistor MN, each of which serves as a state-change stabilizing device, are coupled to a current path of a cell via a bit line BL. That is, PMOS transistor MP and NMOS transistor MN, the gates of which are applied with Vm and Vg, respectively, correspond to PMOS transistor MP and NMOS transistor MN, respectively, in the state-change stabilizing circuit shown in FIG. 9.

Figures 25, 27:
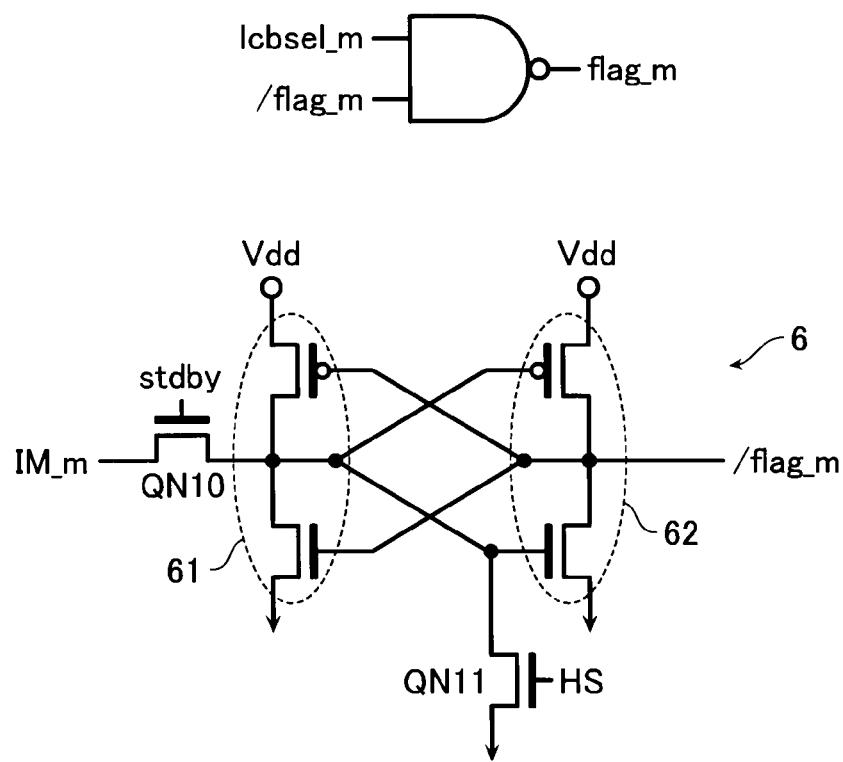
FIG. 25 is a table showing operation modes and the setting conditions of selection signals.
FIG. 27 shows a bad cell detection circuit.

Therefore, as shown in FIG. 25, gate voltages Vm and Vg of these transistors MP and MN, and gate signal "read" applied to NMOS transistor serving as the read switch SW4 are set in accordance with operation modes. As a result, automatic state-change stabilization may be performed in the respective write modes (i.e., set mode and reset mode), and read mode also is stabilized.

Figure 26:
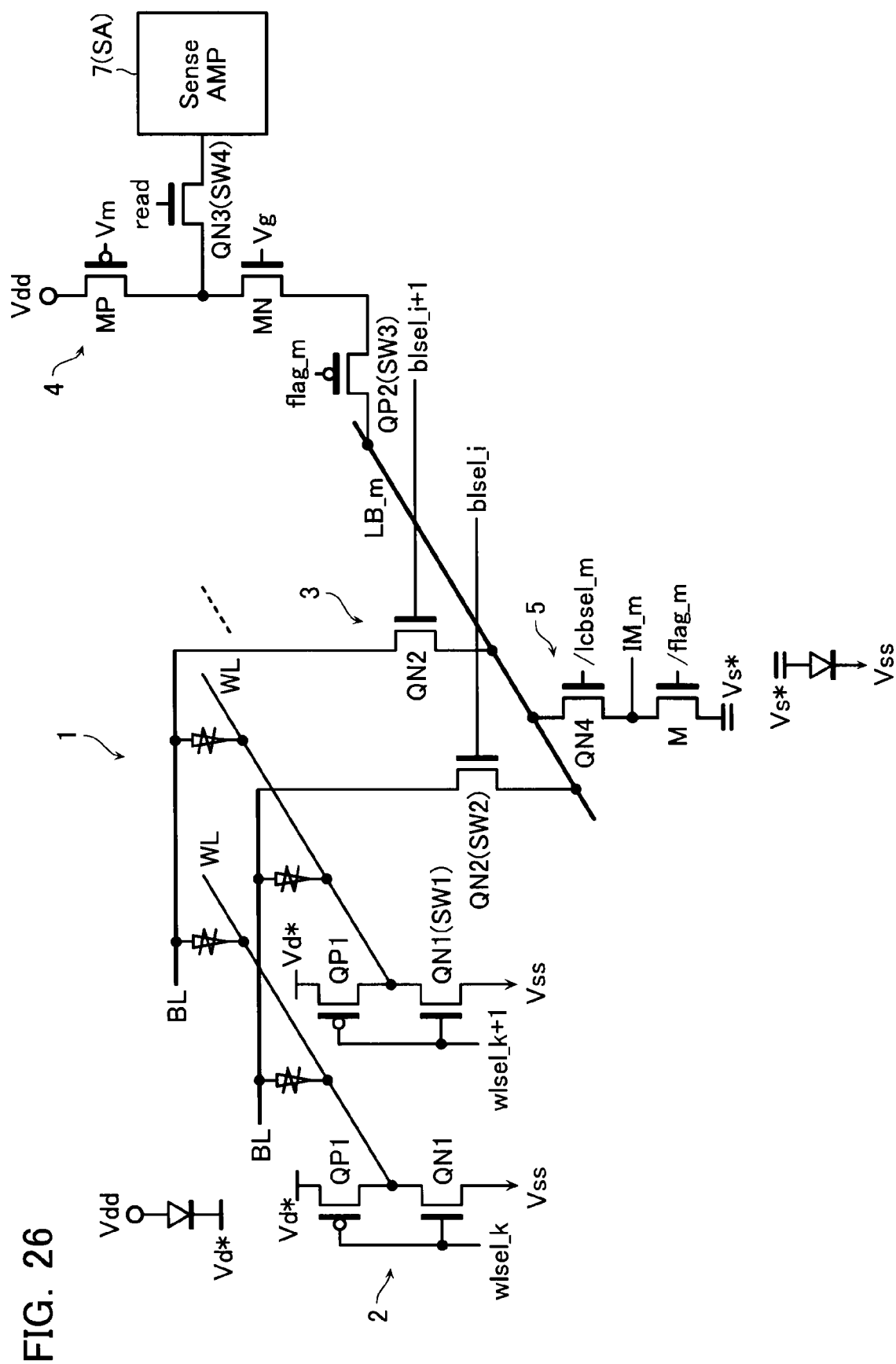
FIG. 26 shows the detailed configuration of the selection circuit shown in FIG. 24.

FIG. 26 shows a detailed configuration of word line and bit line selecting circuit portions. 3-D cell array is divided into multiple cell array units, and one cell array unit 1 defined by a set of bit lines sharing a sense amplifier (SA) 7 is defined as a "stadby unit" here. One bit line in the set of bit lines in the standby unit 1 is selected by bit line select circuit 3 to be coupled to local bus LB_m. As the bit line select circuit 3, only NMOS transistors QN2 are shown here.

Word line driver 2 has CMOS drivers, each of which is formed of PMOS transistor QP1 and NMOS transistor QN1. PMOS transistor serves for setting an unselected word line at Vd* while NMOS transistor QN1 serves for setting a selected word line at Vss. The output impedance of these transistors is set to be as low as possible. As a result, with respect to the selected word line, the word line level may be kept in a sufficiently stable state against cross-fails.

State-change stabilizing circuit 4 is a serial circuit portion of PMOS transistor MP and NMOS transistor MN, which is coupled to a selected bit line via local bus LB. This corresponds to that shown in FIG. 9.

Bit line reset circuit 5 is prepared for setting an unselected bit line at Vs*. This reset circuit 5 has a reset-use NMOS transistor QN4 driven by signal "/lcbsel_m", and bad cell detecting-use NMOS transistor M inserted between the source of NMOS transistor QN4 and Vs*.

To set the word line and bit line potentials, it is in need of generating Vs* higher than the ground potential Vss by the forward voltage drop Vf of diode, and Vd* lower than the power supply voltage Vdd by Vf.

Word line driver 2 is driven by control signal "wlsel_x (x=k, k+1, . . . )" to set one word line (selected word line) at Vss and other unselected word lines at Vd*. Control signal "wlsel_x" is "H" in a hold state in which cell data is to be kept as it is, and "L" (unselected) or "H" (selected) in a state following the standby state, in which cells are accessible.

Bit line select circuit 3 is driven by bit line select signal "blsel_y (y=i, i+1, . . . )", which is output from the bit line decoder. In case NMOS transistor QN2 is used as the select transistor, to transfer a sufficiently high level to a bit line, "H" level of the select signal "blsel_y" is set at Vdd+Vt or higher than it. That is, the select signal "blsel_y" is set as follows: a "H" level of Vdd for unselected standby units; another "H" level of Vdd+Vt or more for a selected bit line and "L" level of Vss for unselected bit lines in a selected standby unit.

Next, it will be explained a method of setting a bit line coupled to a bad cell (i.e., bad bit line) to be floating.

In a standby mode, all bit line select signals "blsel_y" are set at "H", and local bus LB_m is isolated from the sense amplifier system in accordance with flag signal flag_m="H". Therefore, all bit lines are set at the local bus level. In detail, the level of local bus LB_m is Vs* because NMOS transistors QN4 and M are on with local bus select signal /lcbsel_m="H" and flag signal /flag_m="H", respectively.

In case there is a bad cell with a large leakage current in a standby unit 1, the leakage current flows from Vd* level of word line WL to local bus LB_m via bit line BL. When this leakage current flows to Vs*, the drain node of NMOS transistor M (i.e., monitor node IM_m for sensing bit line current)

is boosted. Monitor the level change of the monitor node IM_m, and it becomes possible to detect whether there is a bad cell or not.

FIG. 27 shows a flip-flop 6 serving as a bad cell detecting circuit for detecting whether there is a bad cell or not. This detecting circuit 6 is formed of CMOS inverters 61 and 62 with inputs/outputs cross-coupled. The input node of CMOS inverter 62 is coupled to the monitor node IM_m via NMOS transistor QN10 while output node thereof serves for outputting flag signal /flag_m. Further, the input node of CMOS inverter 62 is coupled to reset-use NMOS transistor QN11.

This detecting circuit 6 is set in an initial state defined by /flag_m="H" with HS="H" in a hold state just after power-on. In a standby state, signal "stdby" becomes "H", and signal HS becomes "L", so that the circuit 6 becomes state-changeable in response to the level of monitor node IM_m. That is, if there are a predetermined number of bad cells, the flip-flop is inverted in response to the level boost of IM_m to output /flag_m="L".

It is preferable that the size of CMOS inverter 61 is set smaller than that of CMOS inverter 62, whereby monitor node IM_m does not draw large current. Further, it is preferable to suitably set the threshold level of CMOS inverter 62 on the input side, thereby setting an allowable leakage value.

If signal "/flag_m" becomes "L", local bus LB_m is selected by flag_m="H" to be kept at "H" even if "lcbsel_m" becomes "H", so that the sense amplifier isolated state is kept as it is. At this time, further, transistor M becomes off, and local bus LB_m is set in a floating state, so that bit lines are set in a floating state even if selected.

If there is no bad cell, signal "/flag_m" is "H", so that signal "stdby" becomes "L". Further, If local bus select signal "/lcbsel_m" becomes "H", "flag_m" becomes "L", whereby local bus LB_m is coupled to the sense amplifier system. At this time, local bus LB_m is isolated from Vs* because signal "lcbsel_m is "L".

Go to access cycle hereinafter, and select signal "blsel_y" becomes a "H" level higher than Vdd+Vt for only selected bit line, and other unselected bit lines are separated from local bus LB_m to be floating.

Figure 28:
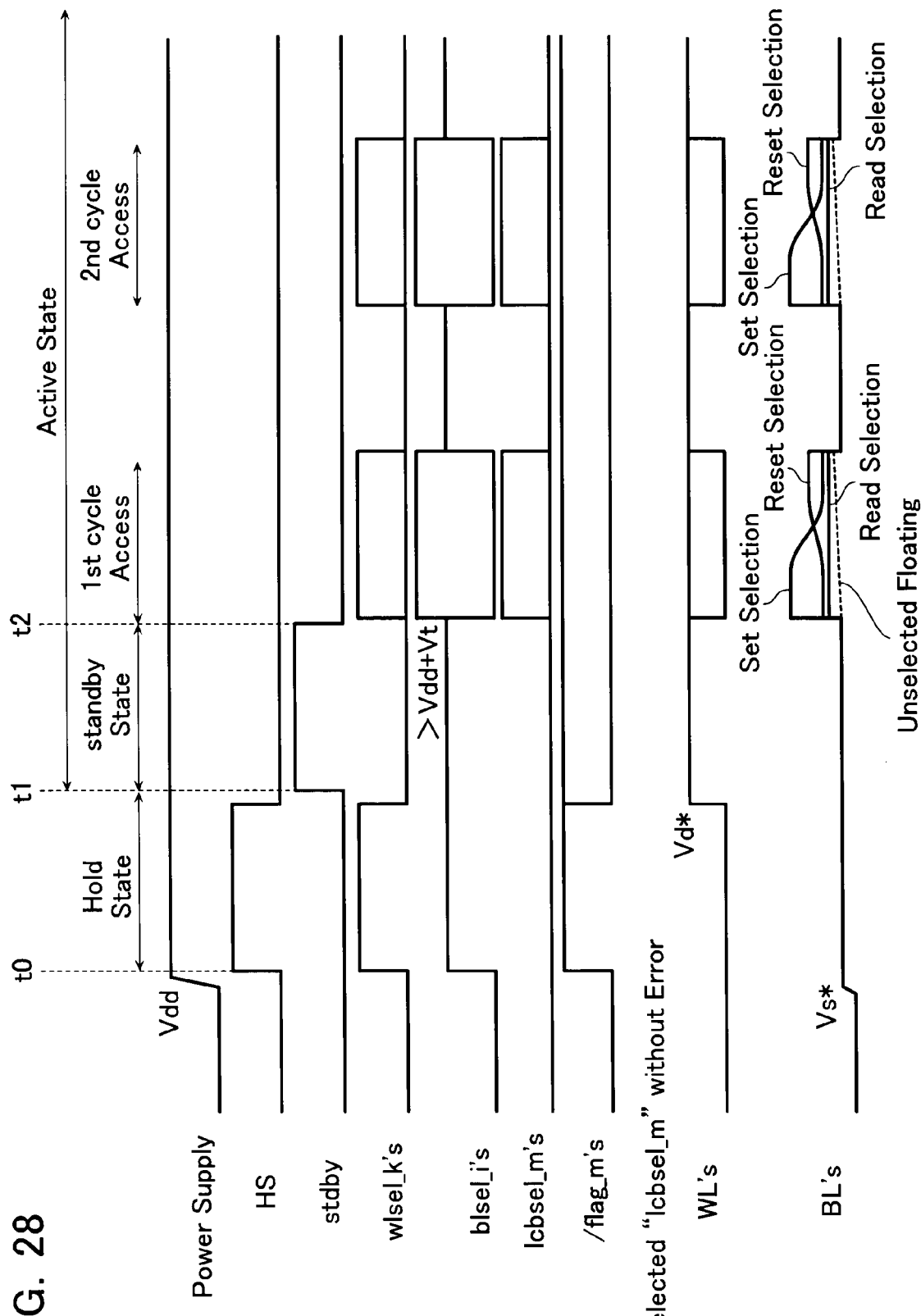
FIG. 28 shows operation waveforms of the circuit shown in FIG. 27.

FIG. 28 shows operation timing waveforms with respect to the selection circuits. The operation timing and operation modes of the memory will be explained with reference to FIG. 28.

After power-on, the memory system has two operation modes, i.e., a hold state and an active state. The active state is divided into a standby state and an access state. The power supply voltage Vdd is higher than set voltage Vset of variable resistance element VR. As the power supply voltage Vdd, for example, an external power supply voltage may be used. Alternatively, an internal power supply voltage, which is generated from a boost circuit disposed in the memory system, may also be used as Vdd.

When the memory system is set in the hold state after power-on (timing t0), all bit lines and word lines are set at about the ground level Vss. In this hold state, signal "HS" is "H", and both word line and bit line select signals "wlsel_x" and "blsel_y" are "H" of the level Vdd.

While standby unit selection is not performed, selection signal "lcbsel_m" is "L", so that signal "/flag_m" is set at "H" with the flip-flop. As a result, all word lines are set at Vss while all bit lines are set at lower than Vs*.

Then the memory system is set in the active state (timing t1). The initial state of the active state is a standby state, in which signal "HS" is "L"; signal "stdby" is "H"; all word line select signals "wlsel_x" are "L"; and all bit line select signals "blsel_y" are "H".

In this standby state, defect detection is performed for detecting bad cells in the standby unit with sense transistor M in the reset circuit 5. If a bad cell is detected, the flip-flop is inverted, and signal "/flag_m" becomes "L". In the standby unit without a bad cell, signal "flag_m" is kept at "H" as it is.

In the standby unit, in which there is a bad cell, the corresponding bit line is set to be floating and unused. In the standby unit, in which there is no defect, all word line are set at Vd*, and all bit lines are set at Vs*. As a result, the unselected state of cells is kept under the condition that diode backward leakage is suppressed in a minimum level.

When the memory system is led to an access mode after canceling the standby state (timing t2), signals "HS" and "stdby" are set at "L", and information signal "/flag_m" designating the bad standby unit is kept as it is. Each access cycle is a short pulse cycle of about dozens [ns] width.

In each access cycle, word line select signal "wlsel_x" and standby unit select signal "lcbsel_m" is set at "H". Further, in the selected standby unit, bit line select signals "blsel_y" are set as follows: "H" level higher than Vdd+Vt for a selected bit line; and "L" level for unselected bit lines.

As a result, the selected word line will be set at Vss from Vd*. The selected bit line level is changed in level in accordance with operation modes. Although unselected bit lines in the selected standby unit are set to be floating from Vs* or near, Vs* level will be kept in the access cycle.

The selected bit line level in the access cycle is as follows:

In case of changing to a set state (set mode, i.e., "1" write mode), the selected bit line is applied with a level higher than the set voltage Vset of variable resistance element VR in such a manner that the applied level is automatically reduced in accordance with the element VR becomes the low resistance state.

In case of changing to a reset state (reset mode, i.e., "0" write mode), the selected bit line level is set to carry current more than the reset current Ireset in the variable resistance element VR in such a manner that the cell voltage is boosted to a level sufficiently lower than the set voltage Vset in accordance with the element VR becomes the high resistance state.

In case of reading the resistance state of variable resistance element VR (read mode), the selected bit line is set at a low read voltage, and the current flowing the element VR is sensed.

So far, it has been explained that the state stabilizing devices, PMOS transistor and NMOS transistor, are disposed on the anode side of the cell diode to constitute a state-change stabilizing circuit 4. Next, another method of constituting a state-change stabilizing circuit will be explained below.

[State-Change Stabilizing Circuit (4)]

Figure 29:
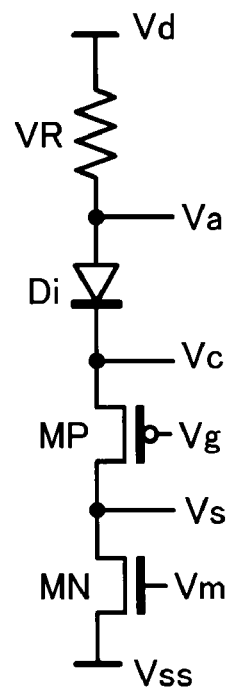
FIG. 29 shows still another state change stabilizing circuit.

FIG. 29 shows a state-change stabilizing circuit adaptable in such a case that signal lines on the cathode side of the cell diode serve as bit lines. That is, variable resistance element VR and diode Di is connected in series to constitute a cell, and PMOS transistor MP and NMOS transistor MN are disposed on the cathode side of diode Di and connected in series to the cell to constitute a state-change stabilizing circuit. This is a combination of the schemes shown in FIGS. 13 and 14.

In this case, the functions of PMOS transistor MP and NMOS transistor MN serving as stabilizing devices are reversed to those in FIG. 9.

Supposing that voltages of the respective connection nodes are referred to as shown in FIG. 29, current-voltage characteristics of the respective devices will be expressed as follows.

The characteristic of variable resistance element VR is expressed by $I=(Vd-Va)R$ while the characteristic of diode Di is expressed as follows:

$$I=I0[\exp\{(Va-Vc)/Vf\}-1]; Va-Vc \geq Vf$$

The characteristic of the non-saturation region of PMOS transistor MP is as follows:

$$I=Kp\{(Vg-Vc+Vtp)(Vs-Vc)-(Vs-Vc)^2/2\}; Vs \geq Vg+Vtp$$

The characteristic of the saturation region of PMOS transistor MP is as follows:

$$I=(Kp/2)(Vg-Vc+Vtp)^2; Vs<Vg+Vtp$$

The characteristic of the non-saturation region of NMOS transistor MN is as follows:

$$I=K\{(Vm-Vss-Vt)(Vs-Vss)-(Vs-Vss)^2/2\}; Vm-Vt \geq Vs$$

The characteristic of the saturation region of NMOS transistor MN is as follows:

$$I=(K/2)(Vm-Vss-Vt)^2; Vm-Vt<Vs$$

Figure 30:
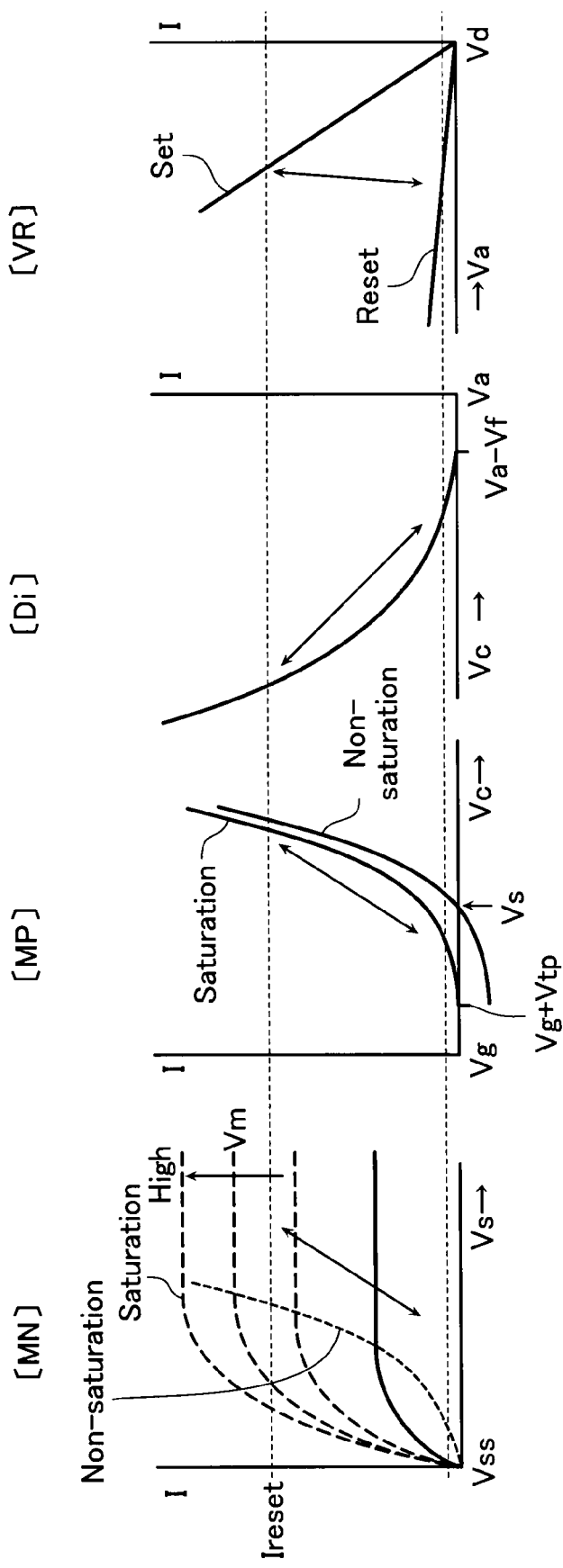
FIG. 30 shows the characteristics of the respective devices in FIG. 16.

FIG. 30 shows the characteristics of the respective devices.

NMOS transistor MN disposed on the ground node Vss side serves as a current limiting device, which prevents the variable resistance element VR from being changed to a set state, while PMOS transistor MP serves as a voltage limiting device, which prevents the variable resistance element VR from being changed to a reset state.

Explaining in detail, in case of changing to the set state, PMOS transistor MP is set in a non-saturation state with a sufficiently low resistance with Vg set lower than Vss, and NMOS transistor MN is set in a saturation state with a little current with Vm lowered, thereby clamping cell current so as to limit it sufficiently less than the reset current Ireset. This current clamping function of the saturation region of NMOS transistor MN prevents the cell from being restored to the reset state. In this case, negative power supply voltage is required.

In case of changing to the reset state, set NMOS transistor MN in a non-saturation state with a sufficiently low resistance with Vm boosted, and the voltage variation of Vs is reduced. By contrast, set PMOS transistor MP is in a saturation state with Vg boosted, thereby suppressing the source voltage reduction. As a result, the voltage applied to the variable resistance element VR may be controlled to be lower than the set voltage Vset even if it is reset.

[State-Change Stabilizing Circuit (5)]

Figure 31:
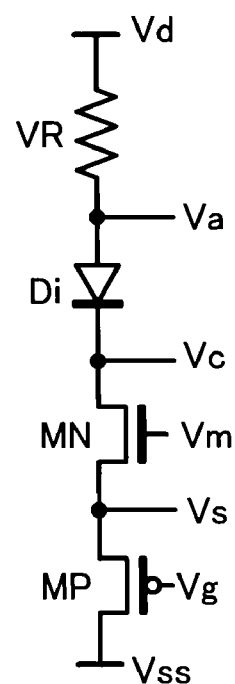
FIG. 31 shows still another state change stabilizing circuit modified from that shown in FIG. 29.
Figure 32:
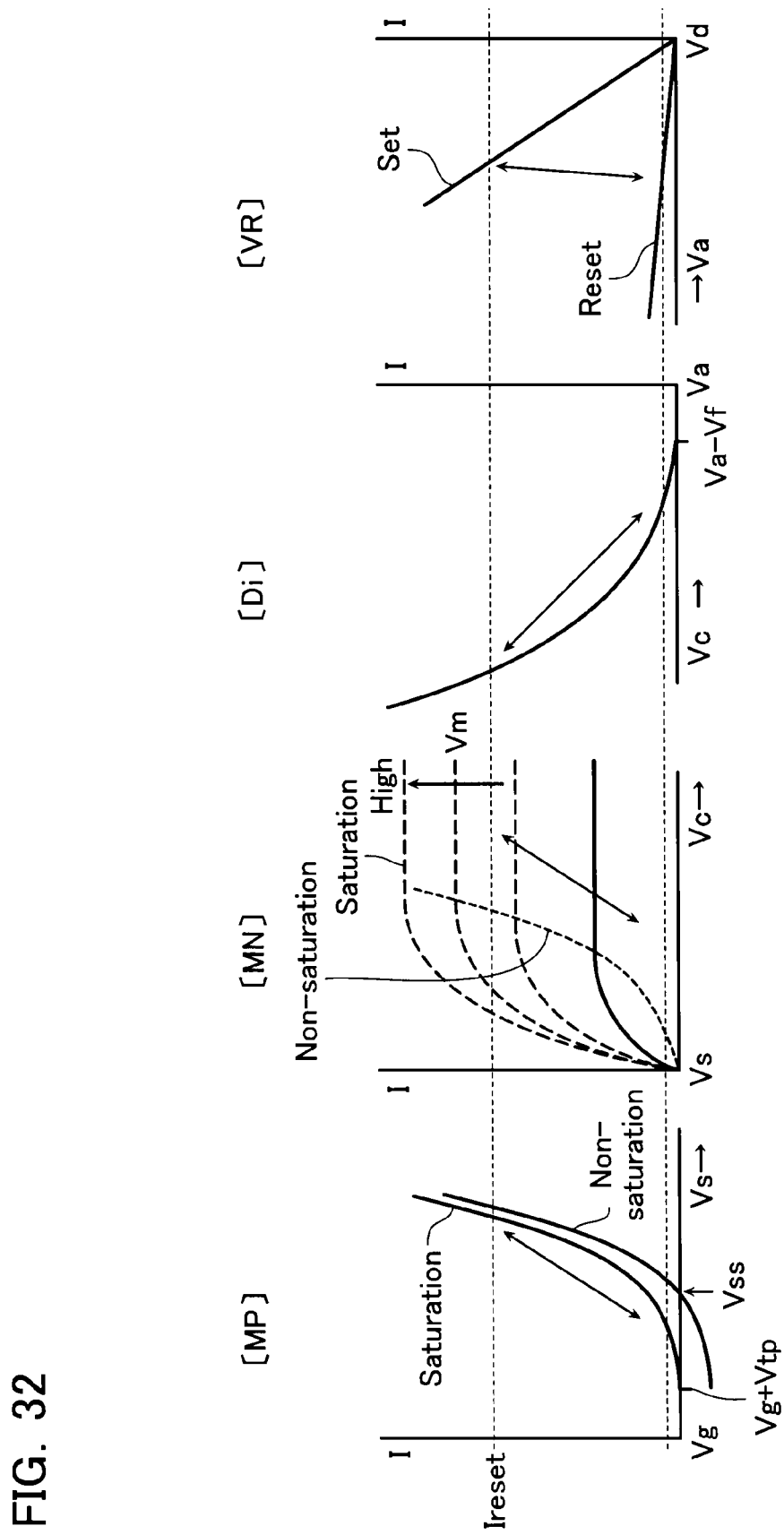
FIG. 32 shows the characteristics of the respective devices in FIG. 31.

FIG. 31 shows a state-change stabilizing circuit, in which PMOS transistor MP and NMOS transistor MN are replaced with each other in comparison with those shown in FIG. 29. FIG. 32 shows the characteristics of the respective devices.

The detailed explanation is omitted. It will be understood from the characteristics shown in FIG. 32 that in spite of the position replacement of PMOS transistor and NMOS transistor, the same stabilizing operation is achieved as described above.

As shown in FIG. 29 or FIG. 31, in case stabilizing devices are disposed on the cathode side of the diode Di, if sense amplifier system is not disposed on the cathode side, it becomes impossible to access freely from cross-fails as apparent from the examined result of the cross-fails. So, with respect to a case that signal lines on the cathode side of diode Di serve as bit lines while other signal lines on the anode side serve as word lines, it will be explained the selecting circuit system around the sense amplifier.

[Voltage-Current Control System—in Case Bit Line is Located on the Cathode Side of Cell Diode]

Figure 33:
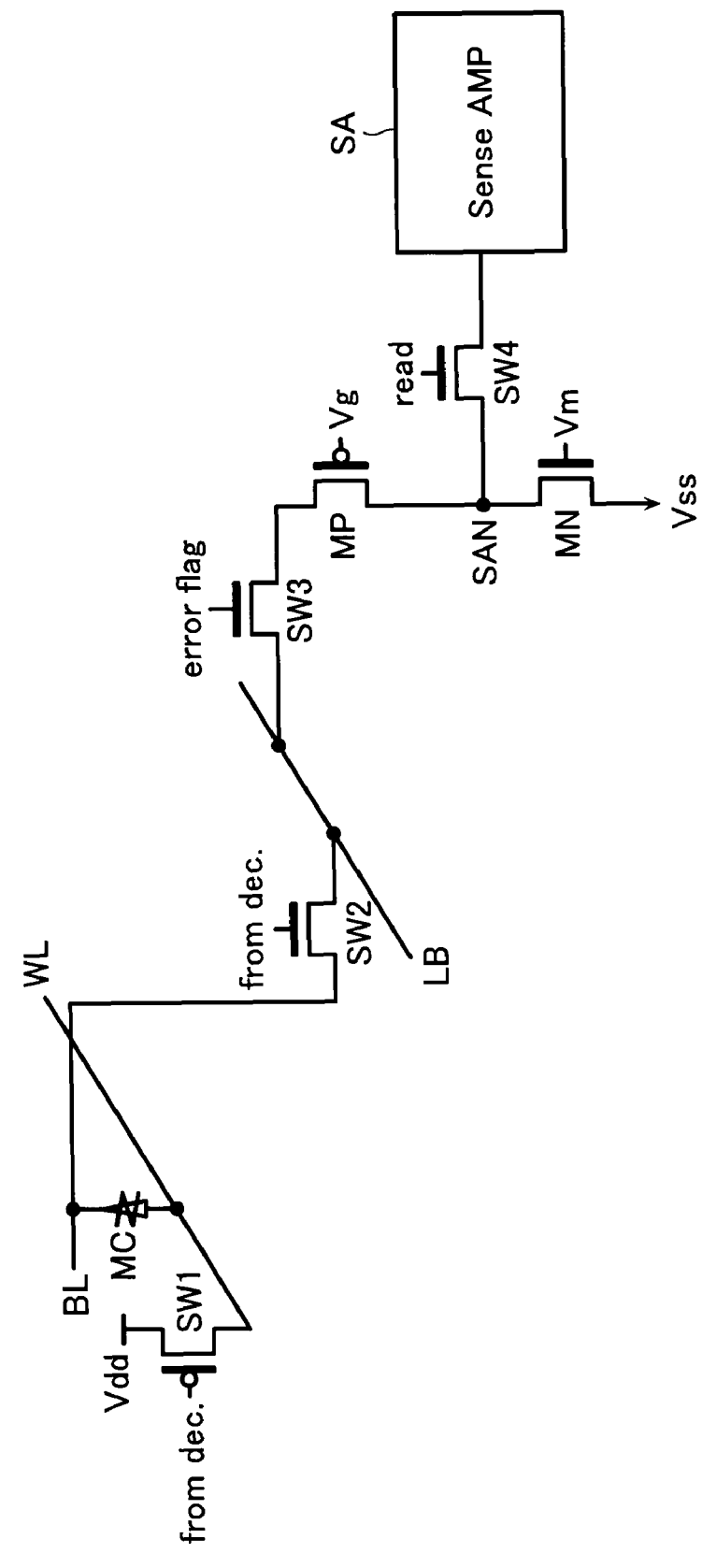
FIG. 33 shows select circuits around the sense amplifier in case the signal lines on the cathode side of cell diode serve as bit lines.

FIG. 33 shows a voltage-current control system around the sense amplifier SA, which is used in such a case that bit lines are located on the cathode side of diode Di, in correspondence to that shown in FIG. 24. The basic configuration is the same as in FIG. 24.

Bit line BL is coupled to local bus LB via bit line select switch SW2, which is a column gate switch constituted by NMOS transistor driven by decode signal "from dec." higher than Vdd+Vt. With this constitution, when bit line BL is selected, it is coupled to local bus LB.

Word line WL is selectively coupled to the power supply voltage Vdd via word line switch SW1, which is a row decode switch constituted by PMOS transistor driven by decode signal "from dec.".

Local bus LB is selectively coupled to sense node SAN via separating-use switch SW3 controlled by an error flag "error flag" and via PMOS transistor MP serving as a state-change stabilizing device with gate voltage Vg applied. The sense node SAN is selectively coupled to the ground potential Vss via NMOS MN serving as another state-change stabilizing device with gate voltage Vm applied.

Switch SW3 is, for example, constituted by an NMOS transistor, and serves for separating the local bus LB, which is coupled a selected bit line in multiple bit lines, from the read/write circuit system. That is, in case there is a cross-fail in a bit line belonging to the local bus LB, the gate signal "error flag" is set at Vss, so that local bus LB is separated from the read/write circuit.

Sense node SAN is coupled to the sense amplifier SA via read switch SW4. Sense amplifier SA is one possible to detect a small current difference.

PMOS transistor MP and NMOS transistor MN, the gates of which are applied with Vg and Vm, respectively, are coupled serially to the current path of memory cell MC via bit line BL. These transistors MP and MN correspond to those in the state-change stabilizing circuit shown in FIG. 29.

Therefore, as shown in FIG. 34, gate voltages Vg and Vm of PMOS transistor MP and NMOS transistor MN, and gate signal "read" of NMOS transistor serving as read switch SW4 are set in correspondence to operation modes. As a result, state-changes in the respective operation modes (set mode and reset mode) are stabilized automatically, and read operation also is stabilized.

Figure 35:
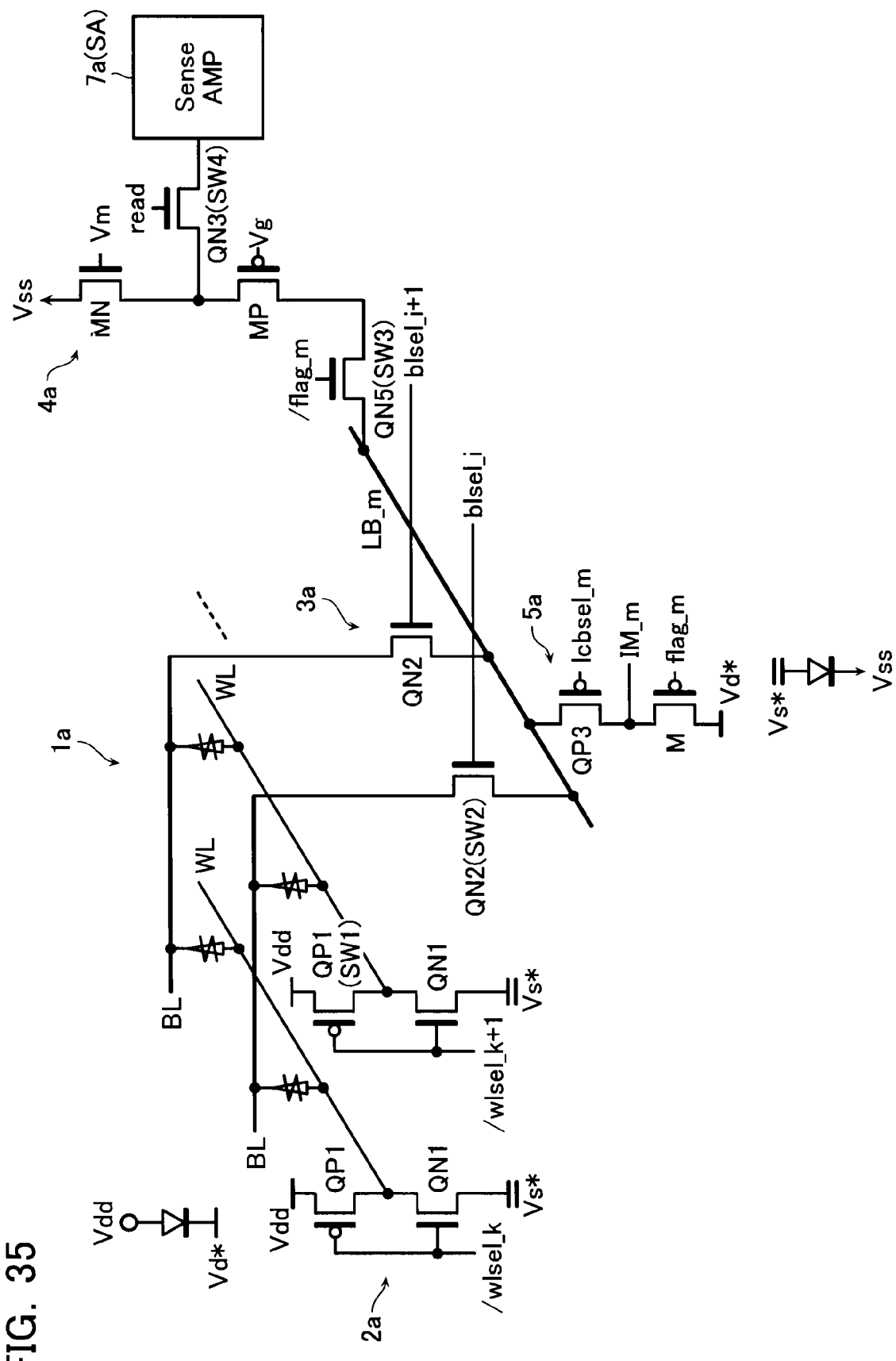
FIG. 35 shows the detailed configuration of the selection circuit shown in FIG. 33.

FIG. 35 shows the detailed configuration of the bit line/word line selecting portion in correspondence to that shown in FIG. 26. Standby unit 1a is defined in 3-D cell array as a range of a set of bit lines sharing a sense amplifier SA. One of these bit lines in a standby unit 1a is selected by bit line select circuit 3a to be coupled to local bus LB_m.

Word line driver 2a is formed of CMOS drivers each having PMOS transistor QP1 for setting a selected word line at Vdd and NMOS transistor QN1 for setting an unselected word line at Vs*. To certainly hold levels of selected and unselected word lines against cross-fails, CMOS driver is formed to have output impedance set to be as low as possible.

State-change stabilizing circuit 4a is formed of PMOS transistor MP and NMOS transistor MN to be coupled to a selected bit line via local bus LB. The circuit 4a corresponds to the state-change stabilizing circuit shown in FIG. 29.

Bit line reset circuit 5a is for setting an unselected bit line at Vd*. This reset circuit 5a has a reset-use PMOS transistor QP3 driven by signal "lcbsel_m", and bad cell detecting-use PMOS transistor M is inserted between the drain of PMOS transistor QP3 and Vd*.

To set the word line and bit line potentials, it is in need of generating Vs* higher than the ground potential Vss by the forward voltage drop Vf of diode, and Vd* lower than the power supply voltage Vdd by Vf.

Word line driver 2a is driven by control signal "/wlsel_x (x=k, k+1, . . . )" to set one word line (selected word line) at Vdd and other unselected word lines at Vs*.

Bit line select circuit 3a is driven by bit line select signal "blsel_y (y=i, i+1, . . . )", which is output from the bit line decoder. In case NMOS transistor QN2 is used as the select transistor, to transfer a sufficiently high level to a bit line, "H" level of the select signal "blsel_y" is set at Vdd+Vt or higher than it.

It will be explained a method of detecting a bit line coupled to a bad cell (i.e., bad bit line) and setting it to be floating.

In a standby mode, all bit line select signals "blsel_y" are set at "H", and local bus LB_m is isolated from the sense amplifier system in accordance with flag signal /flag_m="L". Therefore, all bit lines are set at the local bus level. At this time, the level of local bus LB_m is Vd* because local bus select signal lcbsel_m="L" and flag signal flag_m="L".

In case there is a bad cell with a large leakage current in a standby unit la, the leakage current flows to Vs* via local bus LB_m and bit line BL. When this leakage current flows from Vd*, the drain node of PMOS transistor M (i.e., monitor node IM_m for sensing bit line current) is reduced. Monitor the level change of the monitor node IM_m, and it becomes possible to detect whether there is a bad cell or not.

FIG. 36 shows a flip-flop 6a serving as a bad cell detecting circuit for detecting whether there is a bad cell or not. That is, this detecting circuit 6a is formed of CMOS inverters 61a and 62a with inputs/outputs cross-coupled. The input node of CMOS inverter 62a is coupled to the monitor node IM_m via NMOS transistor QN10 while output node thereof serves for outputting flag signal "flag_m". Further, the input node of CMOS inverter 62a is coupled to reset-use NMOS transistor QN11.

This detecting circuit 6a is set in an initial state defined by flag_m="L" with HS="H" in a hold state just after power-on. In a standby state, signal "stdby" becomes "H", and signal HS becomes "L", so that the circuit 6a becomes state-changeable in response to the level of monitor node IM_m. That is, if there are a predetermined number of bad cells, the flip-flop is inverted in response to the level reduction of IM_m to output flag_m="H".

It is preferable that the size of CMOS inverter 61a is set smaller than that of CMOS inverter 62a, whereby monitor node IM_m does not draw large current. Further, it is preferable to suitably set the threshold level of CMOS inverter 62a on the input side, thereby setting an allowable leakage value.

If signal "flag_m" becomes "H", local bus LB_m is selected by /flag_m="L" to be kept at "L" even if "/lcbsel_m" becomes "L", so that the sense amplifier isolated state is kept as it is. Further, at this time, transistor M becomes off, and local bus LB_m is set in a floating state, so that bit lines are set in a floating state even if selected.

If there is no bad cell, signal "flag_m" is "L". So when signal "stdby" becomes "L", If local bus select signal "/lcbsel_m" becomes "L", "/flag_m" becomes "H", whereby local bus LB_m is coupled to the sense amplifier system. At this time, local bus LB_m is isolated from Vd* because signal "lcbsel_m" is "H".

Go to access cycle hereinafter, and select signal "blsel_y" becomes a "H" level higher than Vdd+Vt for only a selected bit line, and other unselected bit lines are separated from local bus LB_m to be floating.

The above-described embodiments will be summarized as follows.

(1) A resistance change memory device including:
a memory cell formed of a variable resistance element and a diode connected in series, the state of the variable resistance element being reversibly changed in accordance with applied voltage or current; and
a stabilizing circuit so coupled in series to the current path of the memory cell as to serve for stabilizing the state change of the memory cell passively.

(2) The resistance change memory device defined in (1), wherein
the stabilizing circuit includes a transistor coupled in series to the current path, the transistor serving for stabilizing the state change of the memory cell based on the transistor's operating point change brought with the state change.

(3) The resistance change memory device defined in (1), wherein
the stabilizing circuit includes a transistor coupled in series to the current path, the transistor being so gate-biased as to prevent the memory cell from being applied with set-use voltage when the memory cell is applied with reset-use current to be changed to a reset state with a high resistance from a set state with a low resistance.

(4) The resistance change memory device defined in (1), wherein
the stabilizing circuit includes a transistor coupled in series to the current path, the transistor being so gate-biased as to prevent the memory cell from being applied with reset-use current when the memory cell is applied with set-use voltage to be changed to a set state with a low resistance from a reset state with a high resistance.

(5) The resistance change memory device defined in (1), wherein
the stabilizing circuit includes:
a first transistor so coupled in series to the memory cell as to prevent the memory cell from being applied with set-use voltage when the memory cell held in a set state with a low resistance state is applied with reset-use current to be changed to a reset state with a high resistance; and
a second transistor so coupled to the first transistor in series as to prevent the memory cell from being applied with reset-use current when the memory cell held in the reset state is applied with set-use voltage to be changed to the set state.

(6) The resistance change memory device defined in (5), wherein
when the memory cell is changed to the reset state, the second transistor is kept in a low resistance state while the first transistor serves for preventing the memory cell from being applied with the set-use voltage under such a gate bias condition that the source voltage change is suppressed under a certain level.

(7) The resistance change memory device defined in (5), wherein
when the memory cell is changed to the set state, the first transistor is kept in a low resistance state while the second transistor serves for preventing the memory cell from being applied with the reset-use current under such a gate bias condition that the current is clamped under a certain saturation current level.

(8) The resistance change memory device defined in (5), wherein
one of the first and second transistors is a P-channel transistor, and the other is an N-channel transistor.

(9) The resistance change memory device defined in (1), wherein the stabilizing circuit is disposed on the anode side of the diode.

(10) The resistance change memory device defined in (1), wherein
the stabilizing circuit is disposed on the cathode side of the diode.

(11) A resistance change memory device including:
a cell array including first and second signal lines crossing each other and memory cells disposed at the cross-points of the first and second signal lines, the memory cell having a variable resistance element and diode connected in series, the state of the variable resistance element being reversibly changed in accordance with applied voltage or current;
a sense amplifier selectively coupled to a bit line, one of the first and second signal lines serving as bit lines;
a word line driver configured to selectively drive a word line with low impedance, the other of the first and second signal lines serving as word lines; and
a stabilizing circuit so coupled in series to the current path of a selected memory cell via a selected bit line as to serve for stabilizing the state change of the selected memory cell in a reset or set mode.

(12) The resistance change memory device defined in (11), wherein
the stabilizing circuit includes a transistor coupled in series to the current path, the transistor serving for stabilizing the state change of the selected memory cell based on the transistor's operating point change brought with the state change.

(13) The resistance change memory device defined in (11), wherein
the stabilizing circuit includes a transistor coupled in series to the current path, the transistor being so gate-biased as to prevent the selected memory cell from being applied with set-use voltage when the selected memory cell is applied with reset-use current to be changed to a reset state with a high resistance from a set state with a low resistance.

(14) The resistance change memory device defined in (11), wherein
the stabilizing circuit includes a transistor coupled in series to the current path, the transistor being so gate-biased as to prevent the selected memory cell from being applied with reset-use current when the selected memory cell is applied with set-use voltage to be changed to a set state with a low resistance from a reset state with a high resistance.

(15) The resistance change memory device defined in (11), wherein
the stabilizing circuit includes:
a first transistor so coupled in series to the selected memory cell as to prevent the selected memory cell from being applied with set-use voltage when the selected memory cell held in a set state with a low resistance state is applied with reset-use current to be changed to a reset state with a high resistance; and
a second transistor so coupled in series to the first transistor as to prevent the selected memory cell from being applied with reset-use current when the selected memory cell held in the reset state is applied with set-use voltage to be changed to the set state.

(16) The resistance change memory device defined in (15), wherein
when the selected memory cell is changed to the reset state, the second transistor is kept in a low resistance state while the first transistor serves for preventing the selected memory cell from being applied with the set-use voltage under such a gate bias condition that the source voltage change is suppressed under a certain level.

(17) The resistance change memory device defined in (15), wherein
when the selected memory cell is changed to the set state, the first transistor is kept in a low resistance state while the second transistor serves for preventing the selected memory cell from being applied with the reset-use current under such a gate bias condition that the current is clamped under a certain saturation current level.

(18) The resistance change memory device defined in (15), wherein
one of the first and second transistors is a P-channel transistor, and the other is an N-channel transistor.

(19) The resistance change memory device defined in (11), wherein
the stabilizing circuit is disposed on the anode side of the diode.

(20) The resistance change memory device defined in (11), wherein
the stabilizing circuit is disposed on the cathode side of the diode.

This invention is not limited to the above-described embodiment. It will be understood by those skilled in the art that various changes in form and detail may be made without departing from the spirit, scope, and teaching of the invention.

What is claimed is:
1. A resistance change memory device comprising
a memory cell formed of a variable resistance element and a diode connected in series, the state of the variable resistance element being reversibly changed in accordance with applied voltage or current; and
a stabilizing circuit so coupled in series to the current path of the memory cell as to serve for stabilizing the state change of the memory cell passively, wherein
the stabilizing circuit includes:
a first transistor so coupled in series to the memory cell as to prevent the memory cell from being applied with set-use voltage when the memory cell held in a set state with a low resistance state is applied with reset-use current to be changed to a reset state with a high resistance; and
a second transistor so coupled in series to the first transistor as to prevent the memory cell from being applied with reset-use current when the memory cell held in the reset state is applied with set-use voltage to be changed to the set state.

2. The resistance change memory device according to claim 1, wherein
the first and second transistors serve for stabilizing the state change of the memory cell based on the transistor's operating point change brought with the state change.

3. The resistance change memory device according to claim 1, wherein
the first transistor is so gate-biased as to prevent the memory cell from being applied with set-use voltage when the memory cell is applied with reset-use current to be changed to a reset state with a high resistance from a set state with a low resistance.

4. The resistance change memory device according to claim 1, wherein
the second transistor is so gate-biased as to prevent the memory cell from being applied with reset-use current when the memory cell is applied with set-use voltage to be changed to a set state with a low resistance from a reset state with a high resistance.

5. The resistance change memory device according to claim 1, wherein when the memory cell is changed to the reset state, the second transistor is kept in a low resistance state while the first transistor serves for preventing the memory cell from being applied with the set-use voltage under such a gate bias condition that the source voltage change is suppressed under a certain level.

6. The resistance change memory device according to claim 1, wherein when the memory cell is changed to the set state, the first transistor is kept in a low resistance state while the second transistor serves for preventing the memory cell from being applied with the reset-use current under such a gate bias condition that the current is clamped under a certain saturation current level.

7. The resistance change memory device according to claim 1, wherein one of the first and second transistors is a P-channel transistor, and the other is an N-channel transistor.

8. The resistance change memory device according to claim 1, wherein the stabilizing circuit is disposed on the anode side of the diode.

9. The resistance change memory device according to claim 1, wherein the stabilizing circuit is disposed on the cathode side of the diode.

10. A resistance change memory device comprising:

a cell array including first and second signal lines crossing each other and memory cells disposed at the cross-points of the first and second signal lines, the memory cell having a variable resistance element and diode connected in series, the state of the variable resistance element being reversibly changed in accordance with applied voltage or current;

a sense amplifier selectively coupled to a bit line, one of the first and second signal lines serving as bit lines;

a word line driver configured to selectively drive a word line with low impedance, the other of the first and second signal lines serving as word lines; and a stabilizing circuit so coupled in series to a current path of a selected memory cell via a selected bit line as to serve for stabilizing the state change of the selected memory cell in a reset or set mode, wherein the stabilizing circuit includes:

a first transistor so coupled in series to the selected memory cell as to prevent the selected memory cell from being applied with set-use voltage when the selected memory cell held in a set state with a low resistance state is applied with reset-use current to be changed to a reset state with a high resistance; and a second transistor so coupled in series to the first transistor as to prevent the selected memory cell from being applied with reset-use current when the selected memory cell held in the reset state is applied with set-use voltage to be changed to the set state.

11. The resistance change memory device according to claim 10, wherein the first and second transistors serve for stabilizing the state change of the selected memory cell based on the transistor's operating point change brought with the state change.

12. The resistance change memory device according to claim 10, wherein the first transistor is so gate-biased as to prevent the selected memory cell from being applied with set-use voltage when the selected memory cell is applied with reset-use current to be changed to a reset state with a high resistance from a set state with a low resistance.

13. The resistance change memory device according to claim 10, wherein the second transistor is so gate-biased as to prevent the selected memory cell from being applied with reset-use current when the selected memory cell is applied with set-use voltage to be changed to a set state with a low resistance from a reset state with a high resistance.

14. The resistance change memory device according to claim 10, wherein when the selected memory cell is changed to the reset state, the second transistor is kept in a low resistance state while the first transistor serves for preventing the selected memory cell from being applied with the set-use voltage under such a gate bias condition that the source voltage change is suppressed under a certain level.

15. The resistance change memory device according to claim 10, wherein when the selected memory cell is changed to the set state, the first transistor is kept in a low resistance state while the second transistor serves for preventing the selected memory cell from being applied with the reset-use current under such a gate bias condition that the current is clamped under a certain saturation current level.

16. The resistance change memory device according to claim 10, wherein one of the first and second transistors is a P-channel transistor, and the other is an N-channel transistor.

17. The resistance change memory device according to claim 10, wherein the stabilizing circuit is disposed on the anode side of the diode.

18. The resistance change memory device according to claim 10, wherein the stabilizing circuit is disposed on the cathode side of the diode.

* * * * *